(12) United States Patent
Dougakiuchi et al.

(10) Patent No.: US 10,008,829 B2
(45) Date of Patent: *Jun. 26, 2018

(54) QUANTUM CASCADE LASER

(71) Applicant: HAMAMATSU PHOTONICS K.K., Hamamatsu-shi, Shizuoka (JP)

(72) Inventors: Tatsuo Dougakiuchi, Hamamatsu (JP); Kazuue Fujita, Hamamatsu (JP); Akio Ito, Hamamatsu (JP); Tadataka Edamura, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/251,119

(22) Filed: Aug. 30, 2016

(65) Prior Publication Data

US 2017/0063044 A1 Mar. 2, 2017

(30) Foreign Application Priority Data

Aug. 31, 2015 (JP) ................. 2015-170251

(51) Int. Cl.
*H01S 5/14* (2006.01)
*H01S 5/34* (2006.01)
(Continued)

(52) U.S. Cl.
CPC .......... *H01S 5/3402* (2013.01); *H01S 5/0604* (2013.01); *H01S 5/1096* (2013.01);
(Continued)

(58) Field of Classification Search
CPC ........ H01S 5/2018; H01S 5/2027; H01S 5/24; H01S 5/3401; H01S 5/3402; H01S 5/0604; H01S 2302/02
See application file for complete search history.

(56) References Cited

U.S. PATENT DOCUMENTS

2010/0158067 A1* 6/2010 Nakatsuka ........... G02B 6/4206
372/50.124
2015/0311665 A1* 10/2015 Belkin .................. H01S 5/3402
372/20

FOREIGN PATENT DOCUMENTS

JP H08-279647 A 10/1996
JP 09-146131 * 6/1997
(Continued)

OTHER PUBLICATIONS

S. Fathololoumi et al., "Terahertz quantum cascade lasers operating up to ~ 200 K with optimized oscillator strength and improved injection tunneling", Optics Express, vol. 20, 2012, p. 3866-p. 3876.
(Continued)

*Primary Examiner* — Tod T Van Roy
(74) *Attorney, Agent, or Firm* — Drinker Biddle & Reath LLP

(57) ABSTRACT

A quantum cascade laser is configured with a semiconductor substrate, and an active layer provided on a first surface of the substrate and having a multistage lamination of unit laminate structures each of which includes an emission layer and an injection layer. The active layer is configured to be capable of generating first pump light of a frequency $\omega_1$ and second pump light of a frequency $\omega_2$, and to generate output light of a difference frequency $\omega$ by difference frequency generation. An external diffraction grating is provided constituting an external cavity for generating the first pump light and configured to be capable of changing the frequency $\omega_1$, outside an element structure portion including the active layer. Grooves respectively formed in a direction intersecting with a resonating direction are provided on a second surface of the substrate.

5 Claims, 19 Drawing Sheets

(51) Int. Cl.
| | |
|---|---|
| *H01S 5/12* | (2006.01) |
| *H01S 5/06* | (2006.01) |
| *H01S 5/20* | (2006.01) |
| H01S 5/026 | (2006.01) |
| H01S 5/10 | (2006.01) |
| H01S 5/18 | (2006.01) |

(52) U.S. Cl.
CPC ............ *H01S 5/1221* (2013.01); *H01S 5/141* (2013.01); *H01S 5/2018* (2013.01); *H01S 5/0267* (2013.01); *H01S 5/1028* (2013.01); *H01S 5/124* (2013.01); *H01S 5/18* (2013.01); *H01S 2302/02* (2013.01)

(56) References Cited

FOREIGN PATENT DOCUMENTS

| | | |
|---|---|---|
| JP | 2010-521815 A | 6/2010 |
| JP | 2011-035139 A | 2/2011 |
| JP | 2011-243781 A | 12/2011 |
| JP | 2013-098251 A | 5/2013 |
| WO | WO-2008/143737 A2 | 11/2008 |
| WO | WO-2014/018599 A1 | 1/2014 |

OTHER PUBLICATIONS

Y. Jiang et al., "External cavity terahertz quantum cascade laser sources based on intra-cavity frequency mixing with 1.2-5.9THz tuning range", J. Opt, vol. 16, 094002, 2014, p. 1-p. 9.

R Köhler et al., "Terahertz semiconductor-heterostructure laser", Nature, vol. 417, 2002, p. 156-p. 159.

Q.Y. Lu et al., "Room temperature single-mode terahertz sources based on intracavity difference-frequency generation in quantum cascade lasers", Applied Physics Letters, vol. 99, 2011, p. 131106-1-p. 131106-3.

Q.Y. Lu et al., "Widely tuned room temperature terahertz quantum cascade laser sources based on difference-frequency generation", Applied Physics Letters, vol. 101, 2012, p. 251121-1-p. 251121-4.

Q.Y. Lu et al., "Room temperature terahertz quantum cascade laser sources with 215μW output power through epilayer-down mounting", Applied Physics Letters, vol. 103, 2013, p. 011101-1-p. 011101-4.

Q.Y. Lu et al, "Continuous operation of a monolithic semiconductor terahertz source at room temperature", Applied Physics Letters, vol. 104, 2014, p. 221105-1-p. 221105-5.

C. Pflügl et al., "Surface-emitting terahertz quantum cascade laser source based on intracavity difference-frequency generation", Applied Physics Letters, vol. 93, 2008, p. 161110-1-p. 161110-3.

K. Vijayraghavan et al., "Terahertz sources based on Cerenkov difference-frequency generation in quantum cascade lasers", Applied Physics Letters, vol. 100, 2012, p. 251104-1-p. 251104-4.

K. Vijayraghavan et al., "Broadly tunable terahertz generation in mid-infrared quantum cascade lasers", Nature Communications, vol. 4, Art. 2021, 2013, p. 1-p. 7.

U.S. Office Action dated Feb. 6, 2017 that issued in U.S. Appl. No. 15/193,249 including Double Patenting Rejections on pp. 2-3.

* cited by examiner

Fig.13

| SEMICONDUCTOR LAYER | | COMPOSITION | LAYER THICKNESS | DOPING |
|---|---|---|---|---|
| INJECTION BARRIER LAYER 171 | | InAlAs | 3.8nm | undoped |
| EMISSION LAYER 17 | WELL LAYER 161 | InGaAs | 3.8nm | undoped |
| | BARRIER LAYER 172 | InAlAs | 2.3nm | undoped |
| | 162 | InGaAs | 8.5nm | undoped |
| | 173 | InAlAs | 1.0nm | undoped |
| | 163 | InGaAs | 6.9nm | undoped |
| | 174 | InAlAs | 1.1nm | undoped |
| | 164 | InGaAs | 5.6nm | undoped |
| EXIT BARRIER LAYER 191 | | InAlAs | 1.2nm | undoped |
| INJECTION LAYER 18 | WELL LAYER 181 | InGaAs | 4.8nm | undoped |
| | BARRIER LAYER 192 | InAlAs | 1.3nm | undoped |
| | 182 | InGaAs | 4.5nm | undoped |
| | 193 | InAlAs | 1.4nm | undoped |
| | 183 | InGaAs | 4.2nm | undoped |
| | 194 | InAlAs | 1.6nm | Si doped: $9 \times 10^{16}/cm^3$ |
| | 184 | InGaAs | 4.1nm | Si doped: $9 \times 10^{16}/cm^3$ |
| | 195 | InAlAs | 1.8nm | Si doped: $9 \times 10^{16}/cm^3$ |
| | 185 | InGaAs | 4.0nm | Si doped: $9 \times 10^{16}/cm^3$ |
| | 196 | InAlAs | 2.3nm | undoped |
| | 186 | InGaAs | 4.0nm | undoped |
| | 197 | InAlAs | 2.6nm | undoped |
| | 187 | InGaAs | 4.0nm | undoped |

QUANTUM CASCADE LASER

BACKGROUND OF THE INVENTION

Field of the Invention

The present invention relates to a quantum cascade laser using intersubband transitions in a quantum well structure.

Related Background Art

Light in a mid-infrared wavelength range (for example, wavelengths of 5 to 30 μm) is an important wavelength range in the field of spectrometric analysis. As a high-performance semiconductor light source in this wavelength range, attention has been attracted to quantum cascade lasers (QCL) in recent years (e.g., cf. Patent Documents 1 to 3).

The quantum cascade laser is a monopolar type laser element which uses a level structure including subbands formed in a semiconductor quantum well structure, to generate light by transitions of electrons between the subbands, wherein quantum well emission layers, each of which is formed in the quantum well structure and serves as an active region, are cascade-coupled in multiple stages, thereby enabling realization of high-efficiency and high-output operation. This cascade coupling of the quantum well emission layers is realized by use of electron injection layers for injecting electrons into emission upper levels, so as to alternately stack the quantum well emission layers and the injection layers.

Patent Document 1: International Publication No. WO 2014/018599
Patent Document 2: Japanese Patent Application Laid-Open Publication No. H8-279647
Patent Document 3: Japanese Patent Application Laid-Open Publication No. 2010-521815
Patent Document 4: Japanese Patent Application Laid-Open Publication No. 2011-035139
Patent Document 5: Japanese Patent Application Laid-Open Publication No. 2011-243781
Patent Document 6: Japanese Patent Application Laid-Open Publication No. 2013-098251
Non Patent Document 1: K. Vijayraghavan et al., "Terahertz sources based on Cerenkov difference-frequency generation in quantum cascade lasers", Appl. Phys. Lett. Vol. 100 (2012) pp. 251104-1-251104-4
Non Patent Document 2: K. Vijayraghavan et al., "Broadly tunable terahertz generation in mid-infrared quantum cascade lasers", Nat. Commun. Vol. 4 Art. 2021 (2013) pp. 1-7
Non Patent Document 3: R. Kohler et al., "Terahertz semiconductor-heterostructure laser", NATURE Vol. 417 (2002) pp. 156-159
Non Patent Document 4: S. Fathololoumi et al., "Terahertz quantum cascade lasers operating up to ~200 K with optimized oscillator strength and improved injection tunneling", Optics Express Vol. 20 (2012) pp. 3866-3876
Non Patent Document 5: Q. Y. Lu et al., "Room temperature single-mode terahertz sources based on intracavity difference-frequency generation in quantum cascade lasers", Appl. Phys. Lett. Vol. 99 (2011) 131106-1-131106-3
Non Patent Document 6: Q. Y. Lu et al., "Widely tuned room temperature terahertz quantum cascade laser sources based on difference-frequency generation", Appl. Phys. Lett. Vol. 101 (2012) pp. 251121-1-251121-4
Non Patent Document 7: Q. Y. Lu et al., "Room temperature terahertz quantum cascade laser sources with 215 μW output power through epilayer-down mounting", Appl. Phys. Lett. Vol. 103 (2013) pp. 011101-1-011101-4
Non Patent Document 8: Q. Y. Lu et al., "Continuous operation of a monolithic semiconductor terahertz source at room temperature", Appl. Phys. Lett. Vol. 104 (2014) pp. 221105-1-221105-5
Non Patent Document 9: C. Pflugl et al., "Surface-emitting terahertz quantum cascade laser source based on intracavity difference-frequency generation", Appl. Phys. Lett. Vol. 93 (2008) pp. 161110-1-161110-3
Non Patent Document 10: Y. Jiang et al., "External cavity terahertz quantum cascade laser sources based on intracavity frequency mixing with 1.2-5.9 THz tuning range", J. Opt Vol. 16 (2014) 094002 pp. 1-9

SUMMARY OF THE INVENTION

The quantum cascade laser was first successfully lased in 1994 and since then, the lasing wavelength thereof has been actively increased toward longer wavelengths; in 2002, R. Kohler et al. reported the lasing in the terahertz (THz) band (Non Patent Document 3: NATURE Vol. 417 (2002) pp. 156-159). The terahertz band is a so-called far-infrared region of around 100 μm in terms of wavelength, for example, wavelength of from about 60 μm to 300 μm, which is a range corresponding to the boundary between radio waves and light. Since the terahertz light (terahertz wave) has the feature of possessing both of transmitting property of radio wave and rectilinearity of light, application thereof as unprecedented sensing means is under research in various fields including the medical biology, security, communication, cosmic observation, and so on.

It was hard for the semiconductor lasers of conventional structures to realize the increase in wavelength up to the terahertz band, but the quantum cascade lasers have realized lasing in the terahertz band as described above. However, it is the present status that the laser operation is still limited to an extremely-low temperature environment using liquid nitrogen, and there are problems in effectiveness to industrial application.

For example, S. Fathololoumi et al. (Non Patent Document 4: Optics Express Vol. 20 (2012) pp. 3866-3876) reported the maximum operating temperature ~200K at the oscillation frequency of 2.85 THz in the configuration wherein the active layer is configured by cascade coupling of triple quantum well structures of $GaAs/Al_xGa_{1-x}As$ (x=0.15). However, the status quo method is in a situation where it is very difficult to achieve higher-temperature operation.

On the other hand, M. A. Belkin et al. have succeeded in generating the terahertz light (THz light) by difference frequency generation (DFG) through the use of two-wavelength oscillation type mid-infrared QCL and the second order nonlinear optical effect in the QCL (Patent Document 3: Japanese Patent Application Laid-Open Publication No. 2010-521815). It was already confirmed that the QCL for generating the terahertz light by this configuration (DFG-THz-QCL) was able to operate at a room temperature, and further improvement in characteristics is expected.

Recently, a group in Northwestern University also reported the DFG-THz-QCL (Non Patent Document 5: Appl. Phys. Lett. Vol. 99 (2011) 131106-1-131106-3, Non Patent Document 6: Appl. Phys. Lett. Vol. 101 (2012) pp. 251121-1-251121-4, Non Patent Document 7: Appl. Phys. Lett. Vol. 103 (2013) pp. 011101-1-011101-4). Most recently, room temperature continuous operation at a level of μW has been realized, and the output at a level of mW in the room temperature is also reported; however, it is in a situation where a large electric current of 10 A or more is necessary, and further improvement in characteristics is demanded (Non Patent Document 8: Appl. Phys. Lett. Vol. 104 (2014) pp. 221105-1-221105-5).

As one of problems in improvement in characteristics of the THz-QCL, there is reabsorption inside the substrate of the terahertz light generated in the active layer. Even when an InP substrate not doped with impurities is used as a substrate of the quantum cascade laser, for example, an absorption coefficient for the light of the frequency of 3 THz is about 20 cm$^{-1}$. At this time, the coherence length is about 100 µm; therefore, most of the terahertz light generated in the active layer is absorbed inside the substrate without being extracted to the outside.

Currently, in order to realize high extraction efficiency of the terahertz light, a method is used applying Cerenkov phase matching, and, for example, a configuration is used in which an element end face polished at an angle of about 200 or 30° serves as an output end face of the terahertz light (e.g., cf. Patent Document 1: International Publication No. WO 2014/018599, Non Patent Document 1: Appl. Phys. Lett. Vol. 100 (2012) pp. 251104-1-251104-4, Non Patent Document 2: Nat. Commun. Vol. 4 Art. 2021 (2013) pp. 1-7). As a result, terahertz light output at a level of µW has been realized; however, a sufficient output for practical use has not been obtained. In this configuration in which the element end face is polished, the terahertz light that can be extracted to the outside is only the light generated in a range of about several hundred µm near the end face, due to absorption inside the substrate and the like.

In the THz-QCL, an extraction method has been studied of the terahertz light output from an element surface using a metal grating. However, in this configuration, there are problems such as loss of the light due to the metal, and that mode coupling efficiency is not optimized to the terahertz light; currently, a better terahertz output characteristics than the QCL using Cerenkov phase matching has not been obtained (Non Patent Document 9: Appl. Phys. Lett. Vol. 93 (2008) pp. 161110-1-161110-3).

In association with the above-described configuration in which the element end face is polished at a predetermined angle and serves as the output end face of the terahertz light, a configuration has been proposed in which one wavelength of mid-infrared pump light components of two wavelengths to be used for the difference frequency generation is made to be variable by using an external cavity with a diffraction grating in a cavity structure of a laser element, to make the wavelength of the terahertz light variable (Non Patent Document 2: Nat. Commun. Vol. 4 Art. 2021 (2013) pp. 1-7, Non Patent Document 10: J. Opt Vol. 16 (2014) 094002 pp. 1-9). However, in this configuration, there is a problem that, for example, an output angle of the terahertz light from the element end face is changed depending on the wavelength due to refractive index dispersion of the substrate and the like.

The present invention has been made in order to solve the above problem, and an object thereof is to provide a quantum cascade laser capable of suitably outputting light such as the terahertz light generated by the difference frequency generation.

In order to achieve the above object, a quantum cascade laser according to the present invention includes (1) a semiconductor substrate; and (2) an active layer provided on a first surface of the semiconductor substrate and having a cascade structure in which quantum well emission layers and injection layers are alternately stacked in the form of a multistage lamination of unit laminate structures each of which includes the quantum well emission layer and the injection layer, wherein (3) the active layer is configured to be capable of generating first pump light of a first frequency $\omega_1$ and second pump light of a second frequency $\omega_2$ by intersubband emission transitions of electrons, and to generate output light of a difference frequency $\omega$ between the first frequency $\omega_1$ and the second frequency $\omega_2$ by difference frequency generation from the first pump light and the second pump light, and (4) an external diffraction grating is provided constituting an external cavity for generating the first pump light by feeding the light of the first frequency $\omega_1$ back to an element structure portion and configured to be capable of changing the first frequency $\omega_1$, outside the element structure portion including the active layer provided on the first surface of the semiconductor substrate, and (5) a plurality of grooves respectively formed in a direction intersecting with a resonating direction in a laser cavity structure are provided on a second surface opposite to the first surface of the semiconductor substrate.

In the above-described quantum cascade laser, the active layer is configured to be capable of generating light components of two frequencies of the first pump light of the first frequency (angular frequency, hereinafter simply referred to as frequency) $\omega_1$ and the second pump light of the second frequency $\omega_2$. In this configuration, for example, long-wavelength output light such as the terahertz light can be generated as light of a difference frequency $\omega=|\omega_1-\omega_2|$ by using the difference frequency generation by the first pump light and the second pump light.

In addition, outside the element structure portion being a semiconductor laminate structure provided on the first surface of the semiconductor substrate including the active layer, the external diffraction grating is provided constituting the external cavity for generating the first pump light, and the external diffraction grating is configured to be capable of changing the first frequency $\omega_1$ of the light resonating in the external cavity. In this configuration, by changing the frequency $\omega_1$ of the first pump light, the frequency $\omega$ can be made to be variable of the output light such as the terahertz light generated by the difference frequency generation.

In the above configuration, the plurality of grooves are formed extending in a direction intersecting with a resonating direction of light in a laser element, on the second surface being a rear surface of the semiconductor substrate, for the output light generated by the difference frequency generation in the active layer. According to this configuration, the light can be suitably output, such as the terahertz light, generated by the difference frequency generation in the active layer, by making each of side surfaces of the plurality of grooves provided on the substrate rear surface function as an output surface for the output light. Further, in the configuration using the grooves in this way, change of output angle distribution of light can be suppressed by reflection of the light inside the groove and the like, even when the frequency $\omega$ of the output light is made to be variable.

According to the quantum cascade laser of the present invention, the active layer is configured to be capable of generating the first pump light of the first frequency $\omega_1$ and the second pump light of the second frequency $\omega_2$, and to generate the output light of the difference frequency $\omega$ by the difference frequency generation from the first pump light and the second pump light, the external diffraction grating is provided constituting the external cavity for generating the first pump light and configured to be capable of changing the first frequency $\omega_1$, outside the element structure portion including the active layer, and the grooves respectively formed in the direction intersecting with the resonating direction of the light in the laser element are provided on the second surface being the rear surface of the semiconductor substrate, thereby enabling suitable output of the light such as the terahertz light generated by the difference frequency generation.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 13 is a table showing an example of a structure of the unit laminate structure of one period in the active layer.

DESCRIPTION OF THE EMBODIMENTS

Figure 1:
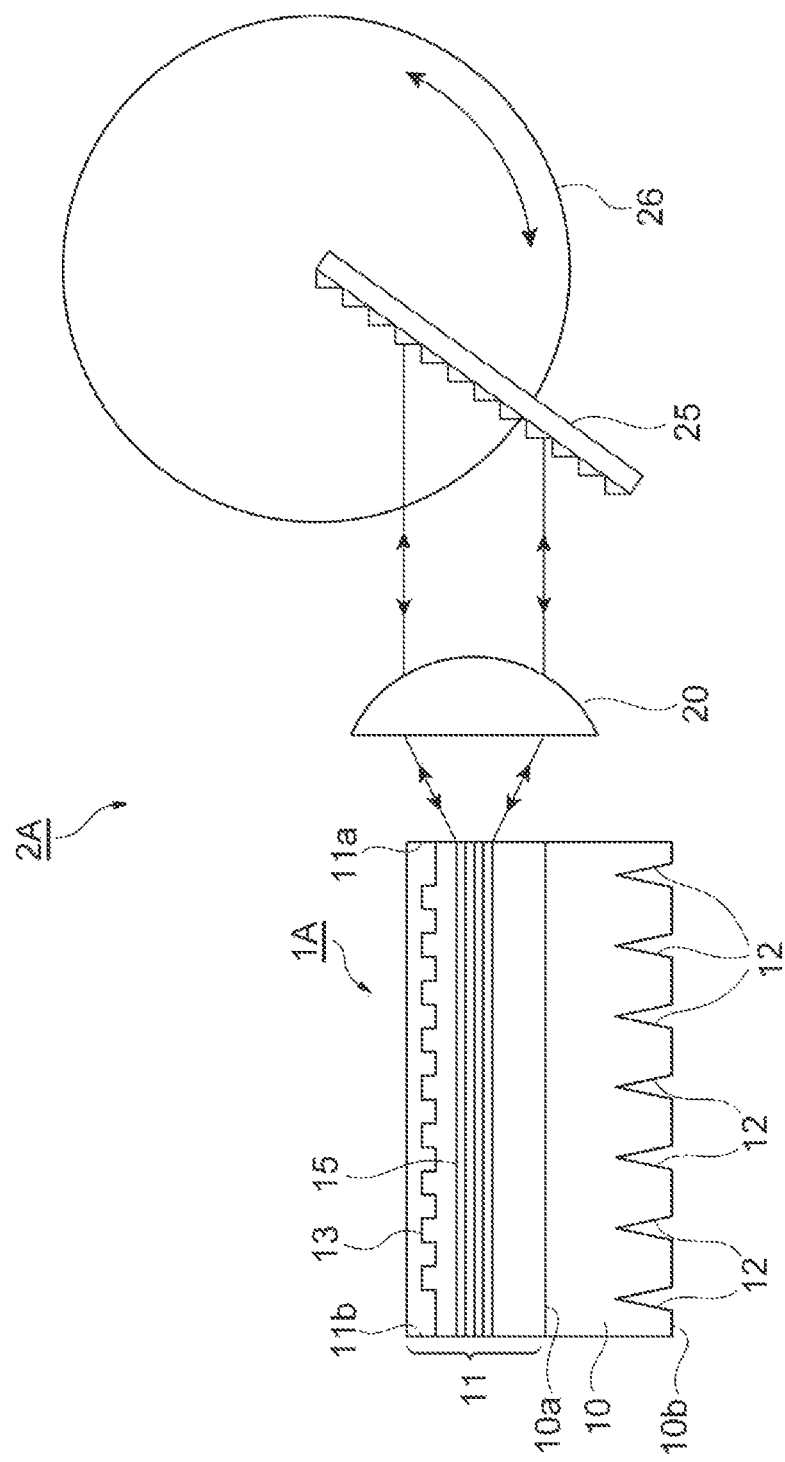
FIG. 1 is a diagram schematically showing a basic configuration of a quantum cascade laser.

Hereinafter, an embodiment of a quantum cascade laser according to the present invention will be described in detail with reference to the drawings. In the description of the drawings, the same elements will be denoted by the same reference signs, without redundant description. The dimensional ratios in the drawings are not always coincident with those in the description.

Figure 2:
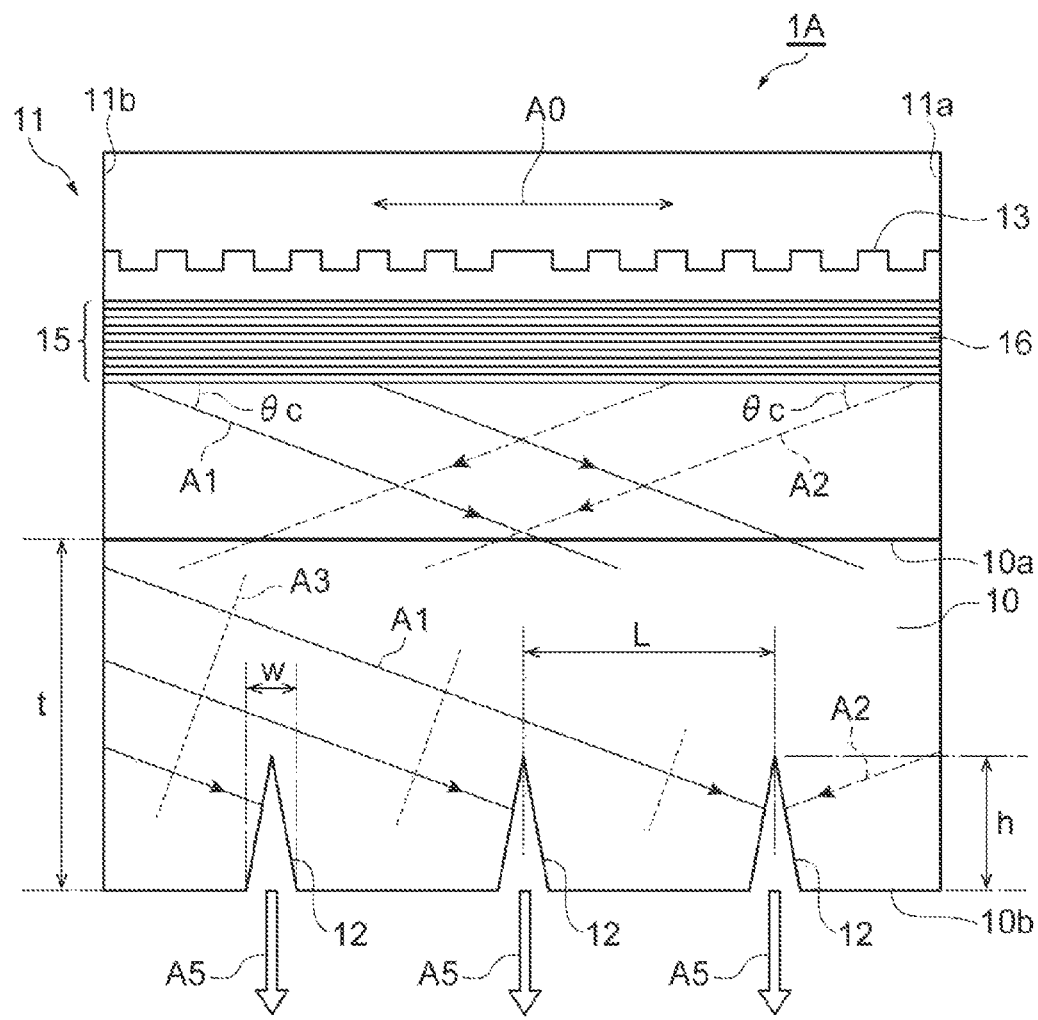
FIG. 2 is a side view showing a configuration of a laser element main body in the quantum cascade laser and generation of output light by difference frequency generation.

FIG. 1 is a diagram schematically showing a basic configuration of a quantum cascade laser. FIG. 2 is a side view showing a configuration of a laser element main body in the quantum cascade laser shown in FIG. 1, and generation of output light by difference frequency generation. A quantum cascade laser 2A of the present embodiment is a monopolar type laser element that generates light by using transitions of electrons between subbands in a semiconductor quantum well structure. The quantum cascade laser 2A includes a laser element main body 1A, a collimating lens 20, and an external diffraction grating 25. In addition, the laser element main body 1A includes a semiconductor substrate 10, and an element structure portion 11 including an active layer 15 formed on a first surface (front surface) 10a of the semiconductor substrate 10.

The active layer 15 has a cascade structure in which quantum well emission layers to be used for generation of light and electron injection layers to be used for injection of electrons into the emission layers are stacked alternately in multiple stages. Specifically, as shown in FIG. 2, when a unit laminate structure 16 of one period is defined as a semiconductor laminate structure consisting of a quantum well emission layer and an injection layer, the active layer 15 having the cascade structure is configured by stacking the unit laminate structure 16 in multiple stages. The number of unit laminate structures 16 stacked including the emission layer and the injection layer is set appropriately according to the specific configuration, characteristics, and the like of the laser element. The active layer 15 is formed on the semiconductor substrate 10 directly, or via another semiconductor layer.

In the laser element main body 1A in the quantum cascade laser 2A of the present embodiment, the active layer 15 is configured to be capable of generating first pump light of a first frequency $\omega_1$ and second pump light of a second frequency $\omega_2$ by intersubband emission transitions of electrons, and to generate output light of difference frequency $\omega = |\omega_1 - \omega_2|$ between the first frequency $\omega_1$ and the second frequency $\omega_2$ by difference frequency generation (DFG) from the first pump light and the second pump light. Here, the frequencies $\omega_1$, $\omega_2$ of pump light components are determined by a subband level structure in the active layer 15, and by an internal diffraction grating 13, the external diffraction grating 25 for frequency (wavelength) selection described later.

In this configuration, each of the first pump light, second pump light of the frequencies $\omega_1$, $\omega_2$ to be generated in the active layer 15 is, for example, mid-infrared light. The light of the frequency $\omega$ to be generated by the difference frequency generation is, for example, long-wavelength light such as the terahertz light. In FIG. 2, a resonating direction (travelling direction of pump light) of the first pump light and the second pump light in a laser cavity structure is shown by an arrow A0. The resonating direction A0 is substantially parallel to the first surface 10a of the substrate 10 on which the element structure portion 11 being the semiconductor laminate structure including the active layer 15 is formed.

Figure 3:
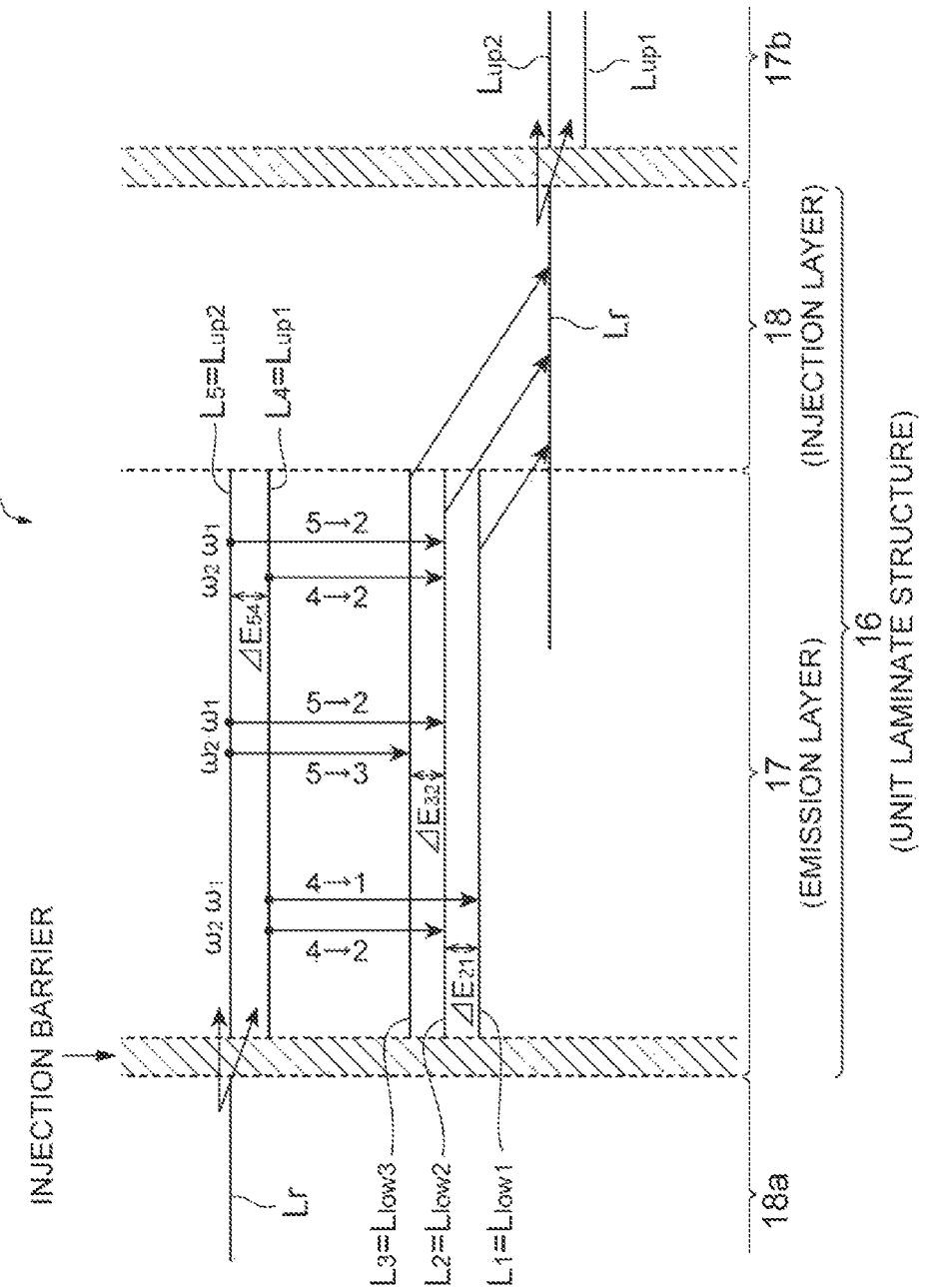
FIG. 3 is a diagram showing an example of a configuration of an active layer of the quantum cascade laser, and a subband level structure in the active layer.

FIG. 3 is a diagram showing an example of a configuration of the active layer 15 of the quantum cascade laser 2A shown in FIG. 1, FIG. 2, and a subband level structure in the active layer 15. The active layer 15 in the present embodiment has a DAU/MS (dual-upper-state to multiple lower state) structure (cf. Patent Document 4: Japanese Patent Application Laid-Open Publication No. 2011-035139, Patent Document 5: Japanese Patent Application Laid-Open Publication No. 2011-243781, Patent Document 6: Japanese Patent Application Laid-Open Publication No. 2013-098251), and is configured to be capable of generating light of the first frequency $\omega_1$ and light of the second frequency $\omega_2$.

As shown in FIG. 3, each of the plurality of unit laminate structures 16 included in the active layer 15 is configured with a quantum well emission layer 17, and an electron injection layer 18. Each of these emission layer 17 and injection layer 18 is formed with a predetermined quantum well structure including quantum well layers and quantum barrier layers. In this configuration, the subband level structure, which is an energy level structure based on the quantum well structure, is formed in the unit laminate structure 16.

The unit laminate structure 16 in the present embodiment, in its subband level structure, has a first emission upper level (level 4) $L_{up1}=L_4$, a second emission upper level (level 5) $L_{up2}=L_5$ having a higher energy than the first emission upper level, and a plurality of emission lower levels. In the configuration example shown in FIG. 3, a relaxation level $L_r$ is provided as a level having a lower energy than the emission lower levels.

The unit laminate structure 16, more specifically in the above subband level structure, has a first emission lower level (level 1) $L_{low1}=L_1$, a second emission lower level (level 2) $L_{low2}=L_2$ having a higher energy than the first emission lower level, and a third emission lower level (level 3) $L_{low3}=L_3$ having a higher energy than the second emission lower level, as the plurality of emission lower levels each having a lower energy than the first emission upper level.

In the unit laminate structure 16 shown in FIG. 3, between the emission layer 17 and an injection layer 18a in the unit laminate structure of the preceding stage, an injection barrier layer for electrons to be injected from the injection layer 18a into the emission layer 17 is provided. An exit barrier layer for electrons from the emission layer 17 to the injection layer 18 is provided as needed between the emission layer 17 and the injection layer 18. However, FIG. 3 shows the configuration example in which only a barrier layer thin enough for the wave function to sufficiently exude is provided between the emission layer 17 and the injection layer 18.

A specific interval configuration of the levels in the subband level structure in the unit laminate structure 16 is as follows: each of an energy $\Delta E_{41}$ of an emission transition (4→1) from the first emission upper level $L_{up1}$ to the first emission lower level $L_{low1}$ and an energy $\Delta E_{52}$ of an emission transition (5→2) from the second emission upper level $L_{up2}$ to the second emission lower level $L_{low2}$ is substantially equal to an energy $E_1$ of the light of the first frequency $\omega_1$ ($\Delta E_{41}=\Delta E_{52}=E_1$). Furthermore, each of an energy $\Delta E_{42}$ of an emission transition (4→2) from the first emission upper level $L_{up1}$ to the second emission lower level $L_{low2}$ and an energy $\Delta E_{53}$ of an emission transition (5→3) from the second emission upper level $L_{up2}$ to the third emission lower level $L_{low3}$ is substantially equal to an energy $E_2$ of the light of the second frequency $\omega_2$ ($\Delta E_{42}=\Delta E_{53}=E_2$). In the present configuration example, the first, second frequencies $\omega_1$, $\omega_2$ are set so as to satisfy the condition $\omega_1>\omega_2$, and the difference frequency is $\omega=\omega_1-\omega_2$.

In the above level structure, each of an energy difference $\Delta E_{21}$ between the first emission lower level $L_{low1}$ and the second emission lower level $L_{low2}$, an energy difference $\Delta E_{32}$ between the second emission lower level $L_{low2}$ and the third emission lower level $L_{low3}$, and an energy difference $\Delta E_{54}$ between the first emission upper level $L_{up1}$ and the second emission upper level $L_{up2}$ is substantially equal to an energy $E=E_1-E_2$ of the light of the difference frequency $\omega$ between the first, second frequencies $\omega_1$, $\omega_2$ ($\Delta E_{21}=\Delta E_{32}=\Delta E_{54}=E$).

In this subband level structure, electrons from the relaxation level $L_r$ in the injection layer 18a of the preceding stage are injected through the injection barrier into the emission layer 17, to strongly excite the second emission upper level $L_{up2}$ coupled to the relaxation level $L_r$. At this time, a sufficient amount of electrons are also supplied to the first emission upper level $L_{up1}$ through a high-speed scattering process such as electron-electron scattering, with the result that sufficient amounts of carriers are supplied to both of the two emission upper levels $L_{up1}$, $L_{up2}$.

The electrons injected into the first, second emission upper levels $L_{up1}$, $L_{up2}$ transit to each of first, second, third emission lower levels $L_{low1}$, $L_{low2}$, $L_{low3}$, so as to generate and emit light with energies corresponding to the energy differences between the subband levels of the emission upper levels and the lower levels; particularly, it results in generating and emitting the first pump light of the first frequency $\omega_1$ with the energy $E_1$ and the second pump light of the second frequency $\omega_2$ with the energy $E_2$.

The electrons having transited to the emission lower levels $L_{low1}$, $L_{low2}$, $L_{low3}$ are relaxed to the relaxation level $L_r$. As the electrons are extracted from the emission lower levels $L_{low1}$, $L_{low2}$, $L_{low3}$ in this manner, population inversion is formed to achieve lasing between the upper levels $L_{up1}$, $L_{up2}$ and the lower levels $L_{low1}$, $L_{low2}$, $L_{low3}$. Here, the relaxation level $L_r$ used for relaxation of electrons is schematically represented by only one level in FIG. 3, but the relaxation level may be configured by a plurality of levels, or a miniband. The electrons relaxed from the emission lower levels to the relaxation level $L_r$ are injected in a cascade manner from the relaxation level $L_r$ through the injection layer 18 into the emission upper levels $L_{up1}$, $L_{up2}$ in an emission layer 17b of the subsequent stage.

As the injection, emission transitions, and relaxation of electrons described above are repeated in the plurality of unit laminate structures 16 constituting the active layer 15, light generation occurs in a cascade manner in the active layer 15. Namely, the emission layer 17 and the injection layer 18 are stacked alternately in a large number of stages, whereby electrons move in a cascade manner in the laminate structures 16 while generating the first pump light of the first frequency $\omega_1$ and the second pump light of the second frequency $\omega_2$ during the intersubband emission transitions in each laminate structure 16. By the difference frequency generation by these first pump light and second pump light, the light of the difference frequency $\omega$ such as the terahertz light is generated and output.

The configuration of the active layer 15 will be further described later along with a specific example thereof. Regarding the active layer 15, various configurations may be used capable of generating the first pump light of the first frequency $\omega_1$ and the second pump light of the second frequency $\omega_2$, besides the configuration shown in FIG. 3.

Referring again to FIG. 1, FIG. 2. In the quantum cascade laser 2A of the present embodiment, as shown in FIG. 1, the external diffraction grating 25 is provided for feeding the light of the first frequency $\omega_1$ back to the element structure portion 11, outside the element structure portion 11 including the active layer 15 provided on the first surface 10a of the semiconductor substrate 10. The external diffraction grating 25, specifically, is arranged at a position facing a first end face 11a in the laser cavity structure of the element main body 1A via the collimating lens 20. Thus, an external cavity (EC) for generating the first pump light of the first frequency $\omega_1$ is configured with a second end face 11b of the laser element main body 1A and the external diffraction grating 25.

In the present configuration example, a rotation stage 26 is provided functioning as a resonance frequency variation mechanism (resonance wavelength variation mechanism) by changing an installation angle to the optical axis by rotationally driving the diffraction grating 25, for the external diffraction grating 25. Thus, the external cavity using the external diffraction grating 25 is configured to be capable of changing the first frequency $\omega_1$ of the first pump light.

In the quantum cascade laser 2A, as schematically shown in FIG. 1, FIG. 2, the internal diffraction grating 13 is provided constituting a distributed feedback (DFB) cavity for generating the second pump light of the second frequency $\omega_2$, inside the element structure portion 11 including the active layer 15. With the above configuration, in the quantum cascade laser 2A of the present embodiment, the frequency $\omega_1$ of the first pump light and the frequency $\omega_2$ of the second pump light are determined by the configuration of the external diffraction grating 25 of the external cavity and the internal diffraction grating 13 of the distributed feedback cavity. In addition, the resonance frequency $\omega_1$ by the external diffraction grating 25 is configured to be variable with the rotation stage 26, so that frequency $\omega$ of the output light generated by the difference frequency generation is made to be variable.

The frequencies $\omega_1$, $\omega_2$ of the pump light components of two wavelengths resonated and generated in the laser cavity structure in the quantum cascade laser 2A may be substantially equal to the frequencies $\omega_1$, $\omega_2$ described above in regard to the energies between levels in the level structure shown in FIG. 3, or need not be equal to the frequencies. Here, in a coupled dual upper level structure (DAU structure) shown in FIG. 3, for example, a unimodal wide band emission spectrum is obtained, as described later. As for the frequencies $\omega_1$, $\omega_2$ of the pump light, a configuration can be used in which, in such emission spectrum, for example, the second frequency $\omega$ determined by the internal diffraction grating 13 is set to be fixed to any frequency not coincident with a gain peak, and the first frequency $\omega_1$ determined by the external diffraction grating 25 is set to be variable to a frequency different from the frequency $\omega_2$. In the level structure of FIG. 3, the frequencies $\omega_1$, $\omega_2$ are set so that $\omega_1 > \omega_2$; however, the frequencies may be set so that $\omega_1 < \omega_2$.

The configuration of the quantum cascade laser 2A including the element main body 1A shown in FIG. 1, FIG. 2 will be further described. In the following description, an example will be mainly described in which each of the first pump light of the first frequency $\omega_1$ and the second pump light of the second frequency $\omega_2$ is mid-infrared light, the output light of the difference frequency $\omega$ is terahertz light, and InP is used as a semiconductor material of the semiconductor substrate 10. Here, the refractive index of the InP substrate in the terahertz band is $n_{THz}=3.6$ for the terahertz light of the frequency of 3 THz. The effective refractive index for the mid-infrared light to be used as the pump light is $n_{MIR}=3.37$. However, the configuration of the quantum cascade laser 2A of the present embodiment is not limited to this configuration.

The quantum cascade laser 2A of the present embodiment uses Cerenkov phase matching in generation and output of the light of the difference frequency $\omega$ by the difference frequency generation. The Cerenkov phase matching is a pseudo phase matching method, and the terahertz output light is emitted in a direction having a finite emission angle $\theta c$ with respect to a travelling direction A0 of the mid-infrared pump light, as shown in FIG. 2 by a solid arrow A1 toward the lower right direction and a dashed arrow A2 toward the lower left direction. In FIG. 2, a dotted line A3 shown with the radiation direction A1 shows the wave front of the terahertz light.

Cerenkov radiation is generated, when pump light components of two wavelengths whose difference frequency $\omega$ corresponds to the terahertz wave enter the nonlinear optical crystal, by induction of second-order nonlinear polarization having spatial distribution according to a phase difference between the components of the two wavelengths. The nonlinear polarization has a frequency to be a difference frequency between the pump light components of two wavelengths, and radiates the terahertz light at timing according to the phase of the nonlinear polarization at each point.

As a result, when the refractive index of the InP substrate in the terahertz band $n_{THz}=3.6$ is greater than the effective refractive index in the mid-infrared region $n_{MIR}=3.37$, due to refractive index dispersion, the terahertz light generated in the crystal propagates in the same phase in the radiation directions A1, A2 shown in FIG. 2. A Cerenkov emission angle $\theta c$ at this time with the frequency of 3 THz is represented by the formula below.

$$\theta c = \cos^{-1}(n_{MIR}/n_{THz}) \sim 20°$$

Namely, in the DFG-THz-QCL in which the semiconductor laminate structure including the active layer 15 is grown on the InP substrate 10, the terahertz light generated by the difference frequency generation propagates downward from the active layer 15 at the emission angle of about 20°, as shown in FIG. 2.

The terahertz light generated in the active layer 15 to be emitted by Cerenkov radiation propagates the inside of the InP substrate 10 in the direction of the above-described emission angle $\theta c$, and finally reaches a second surface (rear surface) 10b being an interface between the substrate 10 and the air outside the element and opposite to the first surface 10a of the substrate 10. At this time, the refractive index of the air $n_{air}=1$ is significantly different from the refractive index of the InP substrate 10 for the terahertz light $n_{THz}=3.6$. For this reason, total reflection occurs on the second surface 10b, and it is difficult to extract the terahertz light as the output light to the outside of the element.

On the other hand, in the quantum cascade laser 2A including the laser element main body 1A shown in FIG. 2, a plurality of grooves 12, respectively formed in a direction intersecting with the resonating direction A0 in the laser cavity structure, are provided on the second surface 10b of the semiconductor substrate 10. In this configuration, the terahertz output light is output below the substrate of the outside from each of the plurality of grooves 12, as schematically shown by an arrow A5 in FIG. 2.

Effects of the quantum cascade laser 2A having the laser element main body 1A of the present embodiment will be described.

In the quantum cascade laser 2A shown in FIG. 1, FIG. 2, the active layer 15 is configured to be capable of generating the light components of two frequencies of the first pump light of the first frequency $\omega_1$ and the second pump light of the second frequency $\omega_2$, as the configuration example of the active layer 15 shown in FIG. 3. In this configuration, by using the difference frequency generation by the first pump light and the second pump light, long-wavelength output light such as the terahertz light can be generated as light of the difference frequency $\omega$.

The external diffraction grating 25 is provided constituting the external cavity for generating the first pump light, outside the element structure portion 11 provided on the first surface 10a of the semiconductor substrate 10 including the active layer 15, and the external diffraction grating 25 is configured to be capable of changing the first frequency $\omega_1$ of light resonating in the external cavity. In this configuration, by making the frequency $\omega_1$ of the first pump light variable, the frequency $\omega$ of the output light such as the terahertz light generated by the difference frequency generation can be variably controlled continuously.

In the quantum cascade laser 2A of the above configuration, the plurality of grooves 12 are formed extending in the direction intersecting with the resonating direction A0 of the light in the laser element, on the second surface 10b being the rear surface of the semiconductor substrate 10, for the output light to be generated by the difference frequency generation in the active layer 15. According to this configuration, the light can be suitably output such as the terahertz light generated by the difference frequency generation in the active layer 15, by making each of side surfaces and inner surfaces of the plurality of grooves 12 provided on the substrate rear surface 10b function as an output surface of the output light. In the configuration using the plurality of grooves 12 for light output to the outside in this way, change of the output angle (output angle distribution) of the light to the outside can be suppressed by reflection of the light inside the groove and the like, even when the frequency $\omega$ of the output light is made to be variable by the external cavity as described above.

Here, in the above configuration, regarding a shape of the groove 12 formed on the substrate rear surface 10b, each of the plurality of grooves 12 is preferably configured to be formed in a curved surface shape in which a width in the groove monotonically decreases from the second surface 10b side and an inclination angle $\theta g$ of a side surface with respect to a direction (semiconductor lamination direction in laser element) perpendicular to the second surface 10b varies in a depth direction. According to this configuration, the output angle of the light is changed depending on a position in the groove side surface, so that change of the output angle distribution due to change of the frequency $\omega$ of the output light can be suitably suppressed.

The quantum cascade laser 2A of the above configuration may be configured so that, as described above, in addition to the external diffraction grating 25 constituting the external cavity, the internal diffraction grating 13 is provided constituting the distributed feedback cavity for generating the second pump light of the second frequency $\omega_2$, inside the element structure portion 11 provided on the first surface 10a of the semiconductor substrate 10. According to this configuration, the first pump light and the second pump light to be used for the difference frequency generation can be suitably generated by suitably setting and controlling the first, second frequencies $\omega_1$, $\omega_2$ of the pump light components by the external cavity with the external diffraction grating 25, and the distributed feedback cavity with the internal diffraction grating 13.

The quantum cascade laser 2A of the above configuration may be configured so that a lens element is provided, through which the output light output from the plurality of grooves 12 to the outside passes, on the second surface 10b of the semiconductor substrate 10. According to this configuration, an output condition such as the output angle distribution of the light to be output to the outside can be suitably set and controlled by the lens element on the second surface 10b. The configuration using such lens element will be further described specifically later.

In the above configuration, regarding the formation direction of the grooves 12 on the second surface 10b of the semiconductor substrate 10, the grooves 12 are preferably respectively formed in a direction perpendicular to the resonating direction A0 of the light on the second surface 10b. In this configuration, each of the side surfaces of the plurality of grooves 12 can be made to suitably function as the output surface for the output light such as the terahertz light.

Regarding the specific configuration of the semiconductor substrate 10, the plurality of grooves 12 of the second surface 10b, and the like in the laser element main body 1A, the semiconductor substrate 10 preferably has the thickness t of 50 μm or more and 200 μm or less.

Each of the plurality of grooves 12 is preferably formed such that the width w is h/10 or more and 2 h or less (1/10 or more and 2 times or less of depth h), where h is the depth of the grooves.

Each of the plurality of grooves 12 is preferably formed such that the depth h is 30 μm or more and t−20 μm or less, where t is the thickness of the semiconductor substrate 10. In addition, each of the plurality of grooves 12 is preferably formed such that the depth h is $\lambda/10$ or more and $2\lambda$ or less (1/10 or more and 2 times or less of wavelength $\lambda$ of output light), where $\lambda$ is the wavelength of the output light.

The plurality of grooves 12 are preferably formed such that the interval L of the grooves is h/2 or more and 2 h/tan $\theta c$+w or less, where h is the depth of the grooves, w is the width of the grooves, and $\theta c$ is the emission angle of the output light by the difference frequency generation. Furthermore, the plurality of grooves 12 are preferably formed such that the interval L of the grooves is h/tan $\theta c$+w/2 or more, where h is the depth of the grooves, w is the width of the grooves, and $\theta c$ is the emission angle of the output light by the difference frequency generation.

Each of the plurality of grooves 12 is preferably formed such that the inclination angle $\theta g$ of the side surface with respect to the direction (semiconductor lamination direction in laser element) perpendicular to the second surface 10b is 4° or more and 20° or less.

According to these configurations, the output light such as the terahertz light can be suitably output with sufficient intensity from each of side surfaces and inner surfaces of the grooves 12 formed on the second surface 10b of the semiconductor substrate 10. Configuration conditions of the semiconductor substrate 10, the plurality of grooves 12, and the like will be further described specifically later.

Figure 4:
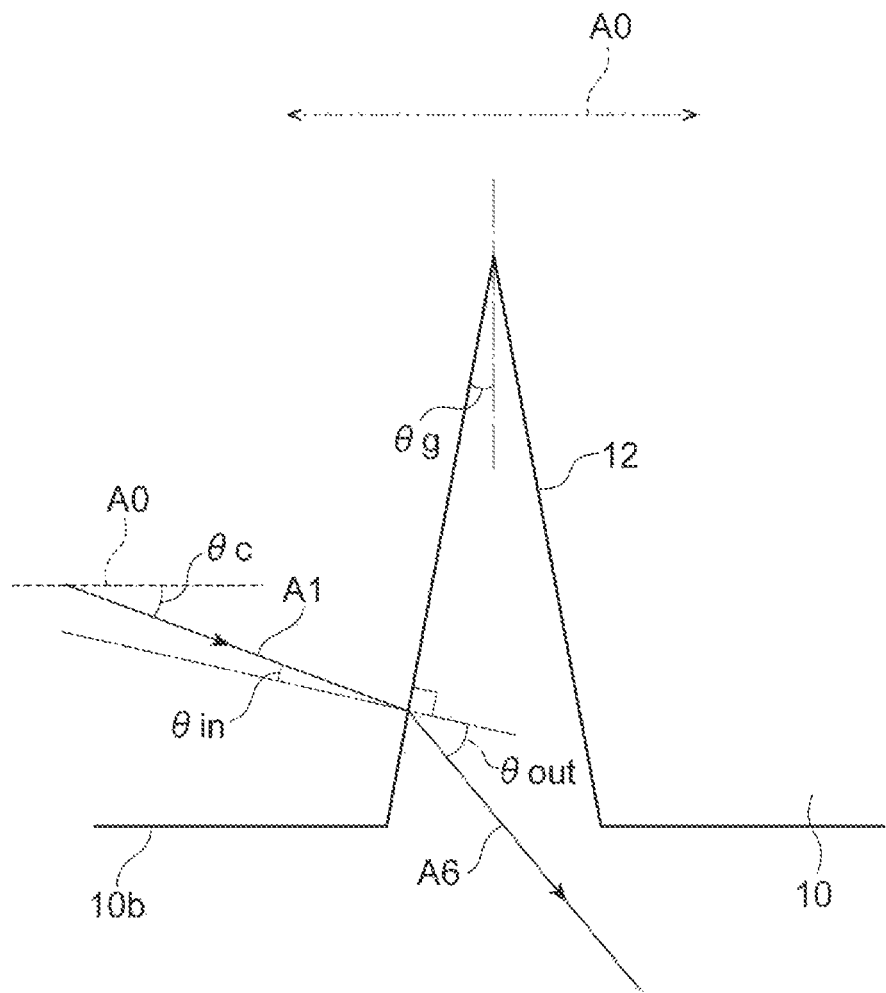
FIG. 4 is a side view showing a configuration of a groove formed on the second surface of the semiconductor substrate.
Figure 5:
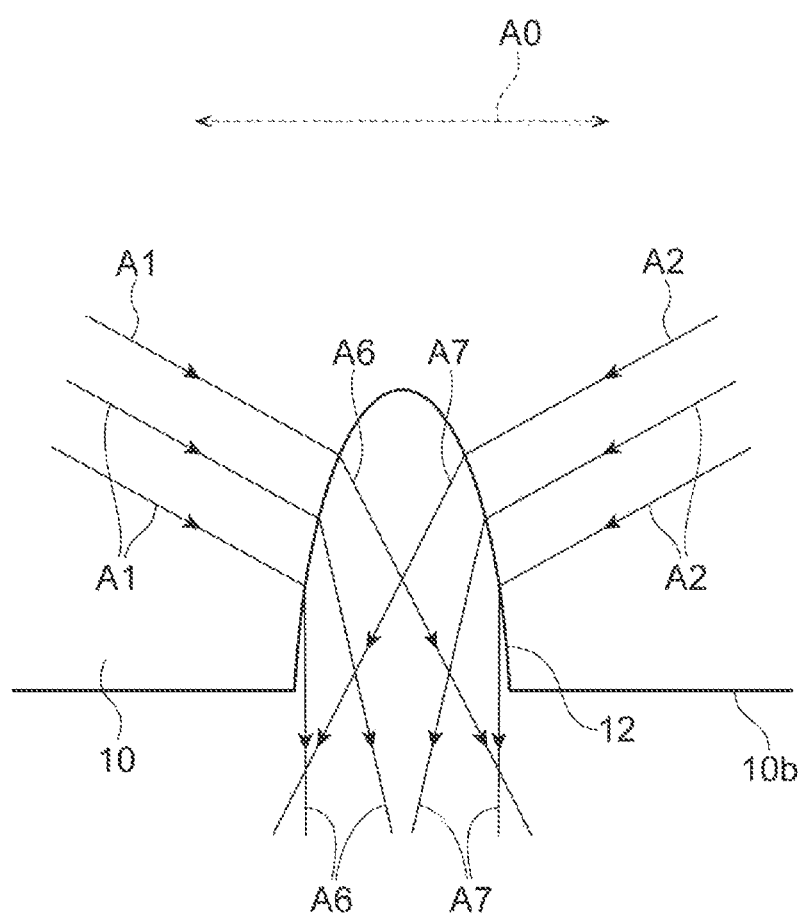
FIG. 5 is a side view showing a configuration of a groove formed on the second surface of the semiconductor substrate.

The output condition of the terahertz light in the plurality of grooves 12 in the quantum cascade laser 2A having the element main body 1A shown in FIG. 1, FIG. 2 will be further described. FIG. 4, FIG. 5 are side views each showing a configuration of the groove 12 formed on the second surface 10b of the semiconductor substrate 10.

In the quantum cascade laser 2A of the above embodiment, as shown in FIG. 4, the plurality of grooves 12 are formed on the second surface 10b of the substrate 10. The terahertz light emitted by Cerenkov radiation in the radiation direction A1 at the emission angle θc is refracted on the interface between the semiconductor and the air on the side surface of the groove 12, to be extracted to the outside as the output light in an output direction A6.

Here, as described above, a case is considered as an example in which the semiconductor substrate 10 is a semi-insulating InP substrate, the emission angle of the terahertz light from the active layer 15 to the downward direction is θc=20° assuming frequency of 3 THz, and the inclination angle of the side surface of the groove 12 with respect to the direction perpendicular to the second surface 10b is θg=10°. In this configuration, the terahertz light propagating inside the substrate 10 enters at an incident angle $\theta_{in}$=100 to the side surface of the groove 12.

At this time, the refractive index of the air is $n_{air}$=1 in contrast with the refractive index of the InP substrate 10 in the terahertz band $n_{THz}$=3.6, and based on the Snell's law $$n_1 \sin \theta_1 = n_2 \sin \theta_2$$

the terahertz light is output refracted at an exit angle $\theta_{out}$=40° from the side surface of the groove 12 to the downward direction. In this configuration, as a result, the terahertz light can be output in a surface direction of the semiconductor substrate 10 through the plurality of grooves 12.

Here, when the inclination angle of the side surface of the groove 12 is θg=0° and the groove side surface is parallel to a cleaved end face, the terahertz light is totally reflected and is not output to the outside. When the terahertz light propagates inside the substrate 10 at the emission angle θc=20°, the terahertz light is output in the surface direction of the substrate 10 without being totally reflected, at the inclination angle θg of the groove side surface of 4° or more. On the other hand, when the inclination angle θg of the groove side surface is greater than 20°, the terahertz light is refracted upward, so that components to be taken in again to the substrate 10 are generated. Therefore, regarding the side surface of the groove 12, the groove 12 is preferably formed so that its inclination angle θg is, for example, 4° or more and 20° or less.

The groove 12 actually formed on the second surface 10b of the semiconductor substrate 10 does not have a pointed shape with the planar side surface as shown in FIG. 4, but has the side surface of a curved surface and has the shape whose inclination angle continuously varies inside the groove as shown in FIG. 5. In this case, as shown in FIG. 5 by propagating directions A1, A2 inside the substrate 10 of the terahertz light and output directions A6, A7 from the groove side surface by solid arrows, the refraction angle of the terahertz light and the exit angle to the outside vary, depending on positions on the groove side surface.

In consideration of this point, regarding the inclination angle θg of the side surface of the groove 12, the groove 12 is preferably formed such that the inclination angle θg satisfies the condition of 4° or more and 20° or less in as many portions as possible of the groove side surface, for example, the surface portions of ⅓ or more of the groove side surface.

In the quantum cascade laser 2A shown in FIG. 1, FIG. 2, the resonance frequency $\omega_1$ in the external cavity using the external diffraction grating 25 is configured to be variable, so that the frequency ω of the terahertz light is made to be variable. For this situation, according to the configuration of outputting the terahertz light from the plurality of grooves 12 formed on the second surface 10b of the substrate 10, change of the output condition such as the output angle distribution of the light to the outside can be suppressed even when the frequency ω of the output light is made to be variable. The output condition to the outside of such terahertz light will be described with reference to FIG. 6 to FIG. 8.

Here, in the description below, as for the output light generated by the difference frequency generation, the terahertz light is mainly assumed of a frequency range from 1 THz to 6 THz. This is because, in a frequency region lower than 1 THz, absorption of the light by free electrons inside the active layer 15 becomes remarkable and available sufficient light output cannot be obtained, and, in a frequency region higher than 6 THz, since there is strong absorption due to longitudinal optical phonons in a semiconductor material constituting the element structure portion 11, available sufficient light output cannot be obtained similarly.

Figure 6:
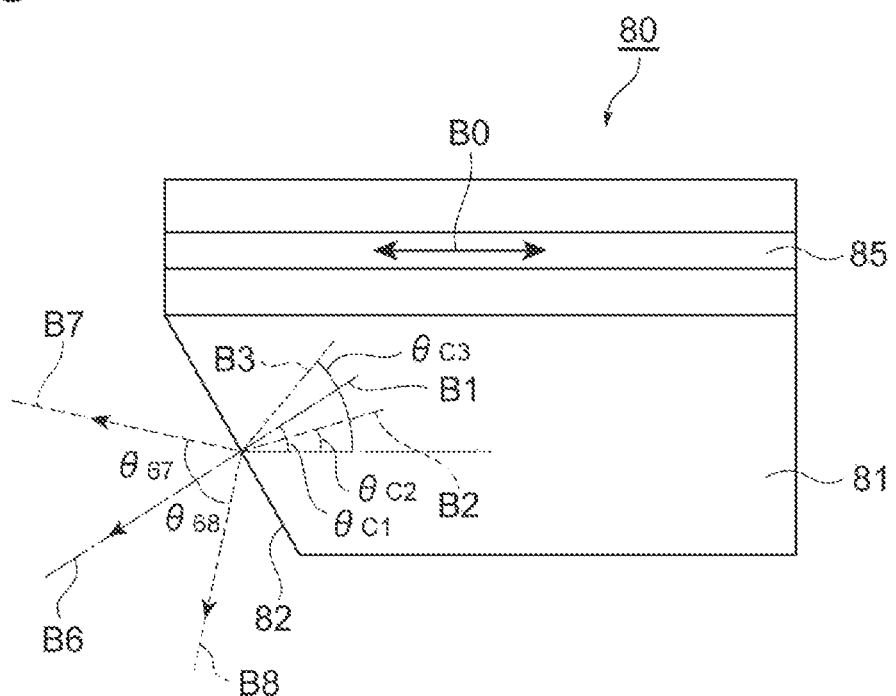
FIG. 6 is a diagram showing an output condition of light in a quantum cascade laser of a conventional configuration.

FIG. 6 is a diagram showing an output condition of light in a quantum cascade laser of a conventional configuration. In a quantum cascade laser 80 shown in FIG. 6, an end face 82 of a substrate 81 is obliquely polished at a predetermined angle to make an output surface of the terahertz light by the difference frequency generation. Here, in FIG. 6, regarding the semiconductor laminate structure on the substrate 81, only an active layer 85 is schematically shown. The resonating direction of the pump light in the active layer 85 is shown by an arrow B0.

As described above, the Cerenkov exit angle θc of the terahertz output light generated by the difference frequency generation is obtained by the following formula.

$$\theta c = \cos^{-1}(n_{MIR}/n_{THz})$$

When the substrate 81 is a semi-insulating InP substrate, $n_{MIR}$ may be constant at $n_{MIR}$=3.37 within a wavelength range related to the difference frequency generation (cf. Non Patent Document 10: J. Opt Vol. 16 (2014) 094002 pp. 1-9). According to Non Patent Document 10, $n_{THz}$=3.5 for the frequency of 1 THz, and $n_{THz}$=3.8 for the frequency of 6 THz. In addition, for the frequency of 3 THz, $n_{THz}$=3.6, as described above.

When the emission angle θc to the resonating direction B0 of the terahertz output light by the difference frequency generation is obtained by the above formula using these refractive index values, an emission angle is $\theta_{c1}$=20° of the terahertz light of 3 THz propagating in a propagating direction B1 inside the substrate 81, an emission angle is $\theta_{c2}$=15.7° of the terahertz light of 1 THz propagating in a propagating direction B2, and an emission angle is $\theta_{c3}$=27.5° of the terahertz light of 6 THz propagating in a propagating direction B3.

When a critical angle of total reflection of when each terahertz light of frequency of 1 THz and 6 THz enters from the semiconductor substrate into the air is obtained by using Snell's law, a total reflection critical angle is 16.6° for the terahertz light of the frequency of 1 THz, and a total reflection critical angle is 15.3° for the terahertz light of the frequency of 6 THz.

When the polishing angle of the substrate end face 82 is 200 for the above-described emission angle θc of the terahertz light, the terahertz light of 3 THz is output to the outside in an output direction B6 along the vertical line of the end face 82. The terahertz light of 1 THz is output to the outside in an output direction B7, and its output angle is $\theta_{67}$=15.2°. The terahertz light of 6 THz is output to the outside in an output direction B8, and its output angle is $\theta_{68}$=29.7°.

Therefore, when the frequency of the terahertz output light is changed in a range from 1 THz to 6 THz by the external cavity using the external diffraction grating in this configuration, the output angle of the light is changed by about 45° along with the frequency change. Such a large change of the output condition of an output beam becomes a problem in application of the terahertz light to an optical system of spectroscopy and the like. In the configuration in which the substrate end face is polished, polishing operation itself is not easy, and in installation of an optical element such as a lens and a mirror for the terahertz output light, for example, installation of the optical element to be used near the output surface of the light such as a hyper-hemispherical lens, alignment of the optical element becomes difficult.

On the other hand, in the above configuration in which the plurality of grooves 12 formed on the second surface 10b of the substrate 10 are used in output of the terahertz light, the change of the output condition of the light to the outside along with the change of the frequency ω can be suppressed by, for example, reflection of the light inside the groove. In particular, each shape of the plurality of grooves 12 is made to be a curved surface shape in which, as shown in FIG. 5, the width in the groove monotonically decreases from the second surface 10b side in the depth direction and the inclination angle θg of the side surface with respect to the direction perpendicular to the second surface 10b continuously varies, so that the change of the output condition due to the change of the frequency ω of the terahertz output light can be suitably suppressed further.

Figure 7:
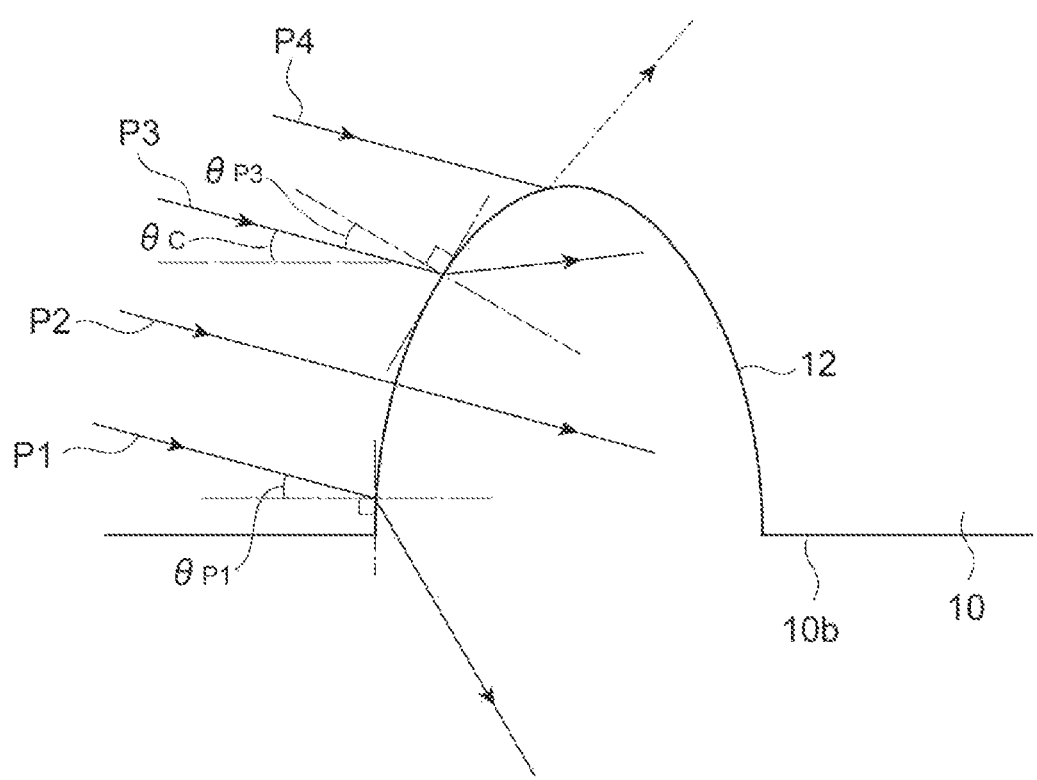
FIG. 7 is a diagram showing an output condition of light from a groove of a curved surface shape.

FIG. 7 is a diagram showing an output condition from the groove 12 having the curved surface shape, of the terahertz light of a frequency of 1 THz, emission angle θc=15.7°. In FIG. 7, an optical path P1 shows output of the light in a case in which a surface portion of the groove side surface into which the light enters is substantially vertical and an incident angle $θ_{P1}$ is close to the emission angle θc. Here, the incident angle of the light on the groove side surface is defined to the vertical line of the tangent line at the surface portion into which the light enters, as shown in FIG. 7. In this case, when the incident angle is 16.6° being the critical angle or less, the terahertz light is output to the outside without being totally reflected. As the incident angle is larger, the output direction of the light approaches the vertical direction to the substrate rear surface 10b by refraction.

An optical path P2 shows a case in which the terahertz light having entered the groove side surface is output to the outside at the output angle same as the incident angle without being refracted. An optical path P3 shows a case in which entrance into the groove side surface of the terahertz light and output to the outside occur in the opposite side of the optical path P1 with respect to the vertical line of the tangent line. In this case too, when an incident angle $θ_{P3}$ is 16.6° being the critical angle or less, the terahertz light is output to the outside without being totally reflected.

In the optical paths P2, P3, the terahertz light is not directly output to the lower side from the substrate rear surface 10b; however, through one or more reflections inside the groove 12, the terahertz light is partially output to the lower side. In an optical path P4, since the incident angle to the groove side surface exceeds the critical angle, the terahertz light is not output to the outside due to total reflection. In addition, such entrance to the groove 12, reflection, and output to the outside of the terahertz light occur symmetrically.

Figure 8:
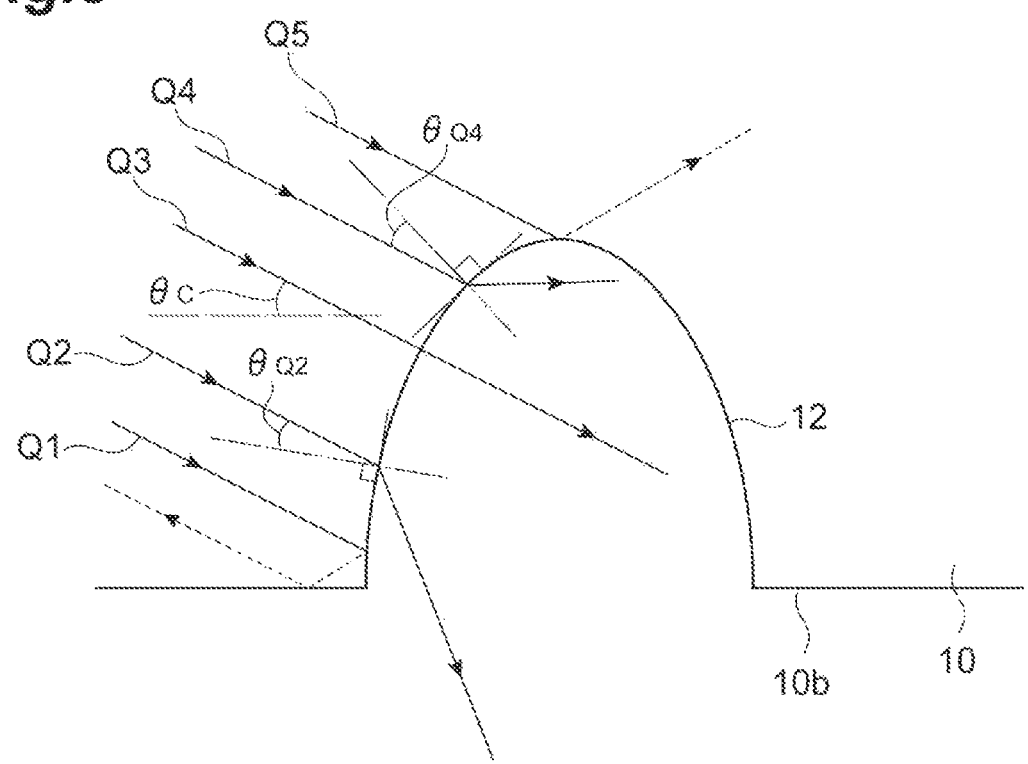
FIG. 8 is a diagram showing an output condition of light from the groove of the curved surface shape.

FIG. 8 is a diagram showing an output condition from the groove 12 having the curved surface shape, of the terahertz light of a frequency of 6 THz, emission angle θc=27.5°. In this case, as shown by an optical path Q1, even at the surface portion through which the terahertz light of the frequency of 1 THz transmits, the terahertz light may be totally reflected in relation to the critical angle of 15.3°. On the other hand, as shown by optical paths Q2, Q3, Q4, transmission of the terahertz light and output to the outside occur in a region of the groove side surface different from the case of the frequency of the 1 THz. In an optical path Q5, the terahertz light is not output to the outside by total reflection.

As shown in FIG. 7, FIG. 8, in the configuration in which the inner surface of the groove 12 formed on the second surface 10b of the semiconductor substrate 10 has the curved surface shape, the terahertz light is output to the outside with similar output angle spread from any region of the groove curved surface, depending on the frequency ω, even when the frequency ω of the terahertz output light and the Cerenkov emission angle θc are changed.

Next, the thickness t of the semiconductor substrate 10 constituting the element main body 1A in the quantum cascade laser 2A will be described. The absorption coefficient in the semi-insulating InP substrate for the terahertz light of the frequency of 3 THz is about 20 cm$^{-1}$ as described above. Inside a waveguide structure including the active layer 15 in the laser element main body 1A, the terahertz light has already undergone absorption of about 20 cm$^{-1}$ due to impurity doping and the like. Considering effects of attenuation of the terahertz light due to the absorption, the thickness t of the semiconductor substrate 10 is preferably made to be as thin as possible by polishing or the like.

However, since thinning the substrate 10 leads to decrease in physical strength of the laser element, there is a certain limit. Ideally, it is preferable that the thickness t of the substrate 10 is thinned to about 50 μm by polishing or the like so that the second surface 10b of the substrate 10 is close to the element structure portion 11 on the substrate 10 functioning as the waveguide structure, and the grooves 12 of the depth h (cf. FIG. 2) of close to 50 μm are formed on the second surface 10b of the substrate 10. This enables the upper end of the groove 12 to be close to the waveguide structure formed on the first surface 10a of the substrate 10.

The thickness t of the semiconductor substrate 10 is, for example, set to 150 μm in the example described later. When the thickness of the semiconductor substrate 10 is greater than 200 μm, the terahertz light is considered to be attenuated to the intensity of half or less. For this reason, the thickness t of the substrate 10 is preferably at least 200 μm or less. Therefore, the thickness t of the semiconductor substrate 10 is preferably 50 μm or more and 200 μm or less.

Considering the terahertz light in the frequency range from 1 THz to 6 THz described above, it is necessary to consider output of the terahertz light of the frequency of 5 to 6 THz that is most easily influenced by absorption of the light. According to Non Patent Document 10, an absorption coefficient of the semi-insulating InP substrate for the terahertz light of 5 to 6 THz is about 30 cm$^{-1}$. At this time, a distance in which the light can propagate, for example, until the light intensity becomes 1/e can be estimated to be 330 μm.

Here, the terahertz light of the frequency of 6 THz propagates inside the substrate 10 at the emission angle θc=27.50. For this reason, when the thickness t of the substrate 10 is 330 μm×sin 27.5°~150 μm or less, the terahertz light can propagate to the second surface 10b of the substrate 10. Furthermore, the terahertz light of the frequency of 6 THz is output to the outside in a relatively deep surface portion of the groove 12 as shown in FIG. 8.

Considering this point, the thickness t of the semiconductor substrate 10 is preferably 200 µm or less, as described above.

Next, the width w of the groove 12 formed on the second surface 10b of the semiconductor substrate 10 will be described. It is preferable that, regarding the width w of the groove 12, the width w is h/10 or more and 2 h or less for the depth h of the groove, and the shape of the groove 12 is any curved surface shape in which the opening portion of the groove 12 is the widest and the width w monotonically decreases in the depth direction of the groove 12.

In a case in which the width of the groove 12 is w=h/10, when it is assumed that a groove shape is symmetrical to the center of the groove 12 and a side surface is planar (cf. FIG. 4), the inclination angle θg is about 5° of the side surface with respect to the direction perpendicular to the second surface 10b of the substrate 10. Therefore, when the width w of the groove 12 is made to be less than h/10, even when the groove side surface is a curved surface, the region is limited in which total reflection can be avoided for the terahertz light of the frequency of 4 to 6 THz of which emission angle θc is large.

When the width of the groove 12 is w=2 h, in any region of the side surface of the groove of a curved surface, the terahertz light can be output to the outside even when it is the terahertz light of any frequency in a range of 1 to 6 THz. However, when the width w of the groove 12 is made to be greater than 2 h, the region becomes small in which the terahertz light can be output to the outside for the terahertz light entering the groove 12, and it is not efficient. Therefore, the width w of the groove 12 is preferably h/10 or more and 2 h or less, as described above. In particular, in order to output the terahertz light efficiently in wideband by widening the region in which the terahertz light can be output in a frequency range of 1 to 6 THz in the side surface of the groove 12 of the curved surface, the width w of the groove 12 is preferably h/5 or more and h/2 or less.

Next, the depth h of the groove 12 formed on the second surface 10b of the semiconductor substrate 10 will be described. When the depth h of the groove 12 is too large, the terahertz light emitted from the groove side surface in the deep portion of the groove 12 may be taken in to the inside of the substrate 10 again inside the groove 12. On the other hand, when the depth h of the groove 12 is too small, an area is small in which the terahertz light propagating inside the substrate 10 reaches the groove side surface.

In consideration of this point, the appropriate depth h of the groove 12 varies depending on the wavelength λ (frequency ω) of the terahertz light, and is considered to be appropriate at about 2 times of the wavelength λ when it is the largest, and at about 1/10 of the wavelength when it is the smallest. Therefore, the depth h of each of the plurality of grooves 12 is preferably λ/10 or more and 2λ or less, for the wavelength λ of the terahertz output light. For example, in a case of the terahertz light of the frequency of 3 THz, the wavelength k is about 100 µm, and the range of the appropriate depth h of the groove 12 is from 10 µm to 200 µm.

Further, regarding the depth h of the groove 12, in order to ensure the mechanical strength of the laser element, a difference between the thickness t of the semiconductor substrate 10 and the depth h of the groove 12 is preferably 20 µm or more. Therefore, an upper limit of the depth h of the groove is t−20 µm in consideration of the thickness t of the substrate.

On the other hand, when the size of the structure is less than 1/10 of the wavelength λ of the light, a phenomenon called Rayleigh scattering occurs, and the light cannot be dealt with in geometrical optics. When considering from 1 THz to 6 THz as the frequency range of the terahertz light as described above, the longest wavelength is λ=300 µm at 1 THz; therefore, 30 µm, which is 1/10 of the wavelength λ, is a lower limit of the depth h of the groove 12. Therefore, the depth h of the groove 12 is preferably 30 µm or more and t−20 µm or less.

Figure 9:
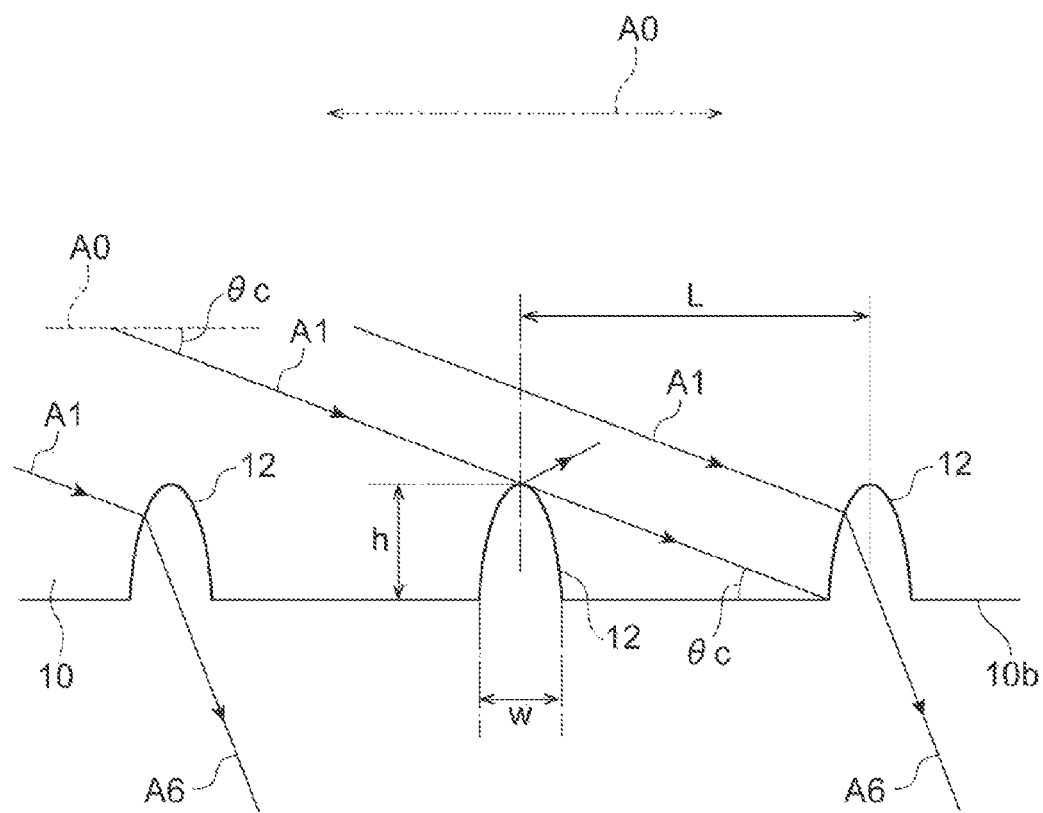
FIG. 9 is a side view showing a configuration of grooves formed on the second surface of the semiconductor substrate.

Next, the interval L between the grooves adjacent to each other in the plurality of grooves 12 formed on the second surface 10b of the semiconductor substrate 10 will be described with reference to FIG. 9. The interval L of the grooves 12 is associated with the depth h. Namely, when the interval L of the grooves 12 is narrow, and the groove 12 is deep, since the terahertz light propagating inside the substrate 10 hits the deep portion of the groove 12 first, the terahertz light cannot reach the shallow portion of the groove 12. Therefore, a surface portion not contributing output of the terahertz light is generated in the side surface of the groove 12.

The interval Lc of the grooves for using entire portions of the side surface of the groove 12 for light output is given by the formula below.

$$Lc = h/\tan\theta c + w/2$$

Here, h is a depth of the groove, w is a width of the groove, and θc is a Cerenkov emission angle of the output light by the above-described difference frequency generation. In this condition, the terahertz light propagating inside the substrate 10 is refracted at the interface between the semiconductor and the air at the side surface of the groove 12. However, the situation varies of the propagating wave front in the air of the terahertz light output from the groove side surface, also depending on the inclination angle θg of the groove side surface. Therefore, in setting of the interval L of the grooves 12, such wave front conditions should also be considered.

When the interval L of the grooves 12 is significantly wider than the above-described interval Lc, a lot of the terahertz light propagating inside the substrate 10 reaches the second surface 10b of the substrate 10 rather than the side surface of the groove 12. For this reason, the interval L of the grooves 12 is preferably 2 times of the above interval Lc or less. For example, the interval L of the grooves 12 is set to 200 µm, in the example described later.

On the other hand, when the interval L of the grooves 12 is narrow, only the deep portion of the side surface of the groove 12 contributes the light output, as described above. Considering this point, the interval L of the grooves 12 is preferably half of the depth h of the groove 12 or more. Therefore, the interval L of the grooves 12 is preferably h/2 or more and 2 h/tan θc+w or less. In the example described later, the range of the appropriate interval L of the grooves 12 is from 17 µm to 206 µm.

Further, the interval L of the grooves 12, in order to use the groove side surface efficiently for light output, is preferably h/tan θc+w/2 or more. When considering the above-described frequency range from 1 THz to 6 THz, considering that the emission angle θc is about 15° for the terahertz light of the frequency of 1 THz, the interval L of the grooves 12 is preferably h/tan 15°+w/2 or more.

In this configuration, it becomes possible that the terahertz light of 1 THz propagating inside the substrate 10 at the shallowest angle when viewed from the substrate rear surface 10b reaches the region of the substrate rear surface 10b side of the grooves 12 without hitting on the grooves adjacent to each other. In particular, since the terahertz light of the frequency of 1 THz is suitably output to the outside in the region near the substrate rear surface 10b, output efficiency of such light is decreased when the interval L of the grooves 12 is less than h/tan 15°+w/2.

The interval L of the grooves 12 in the plurality of grooves 12 is not required to be an equal interval; however, when considering the output efficiency to the outside of the terahertz light, the plurality of grooves 12 is preferably formed at an equal interval by the interval L=h/tan 15+w/2 in the substrate rear surface 10b, for example. In this configuration, the terahertz light generated by the difference frequency generation can be suitably output to the outside over the entire region of the cavity length of the laser element.

The groove structure of the plurality of grooves 12 on the second surface 10b of the semiconductor substrate 10 described above can be processed and formed by, for example, a dicing saw, a scriber, or, in a case of relatively shallow grooves, etching processing, and focused ion beam. When the grooves are formed by using the dicing saw, the scriber, or the like, the groove side surface can be a suitable curved surface shape by applying wet etching after groove processing.

Figure 10:
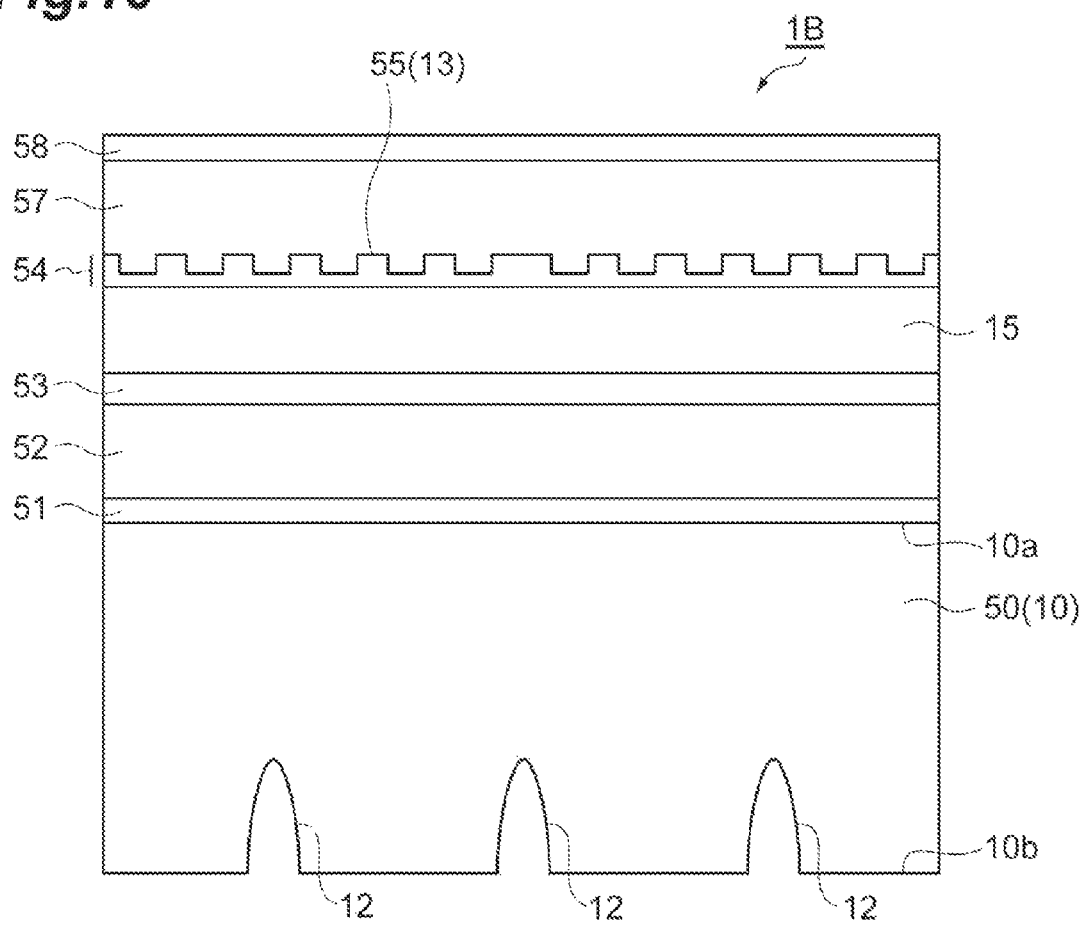
FIG. 10 is a side cross-sectional view showing an example of a specific configuration of the quantum cascade laser.
Figure 11:
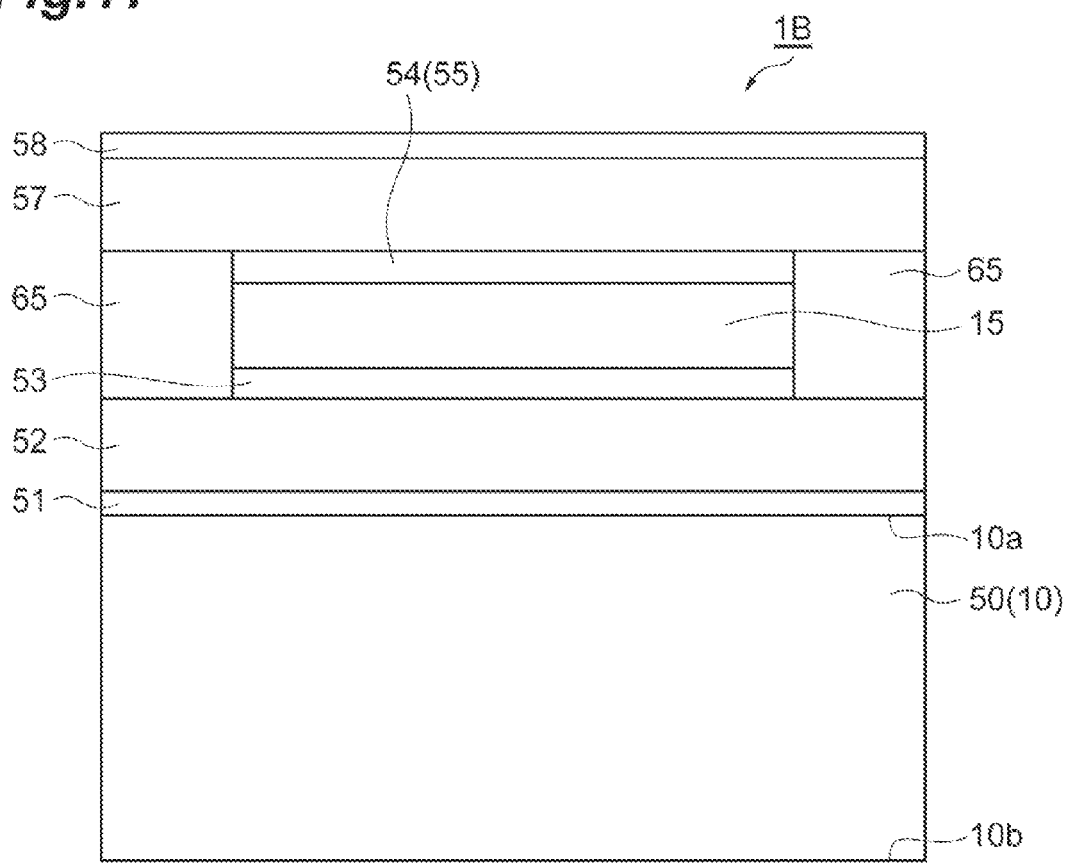
FIG. 11 is a front view showing the example of the specific configuration of the quantum cascade laser.
Figure 12:
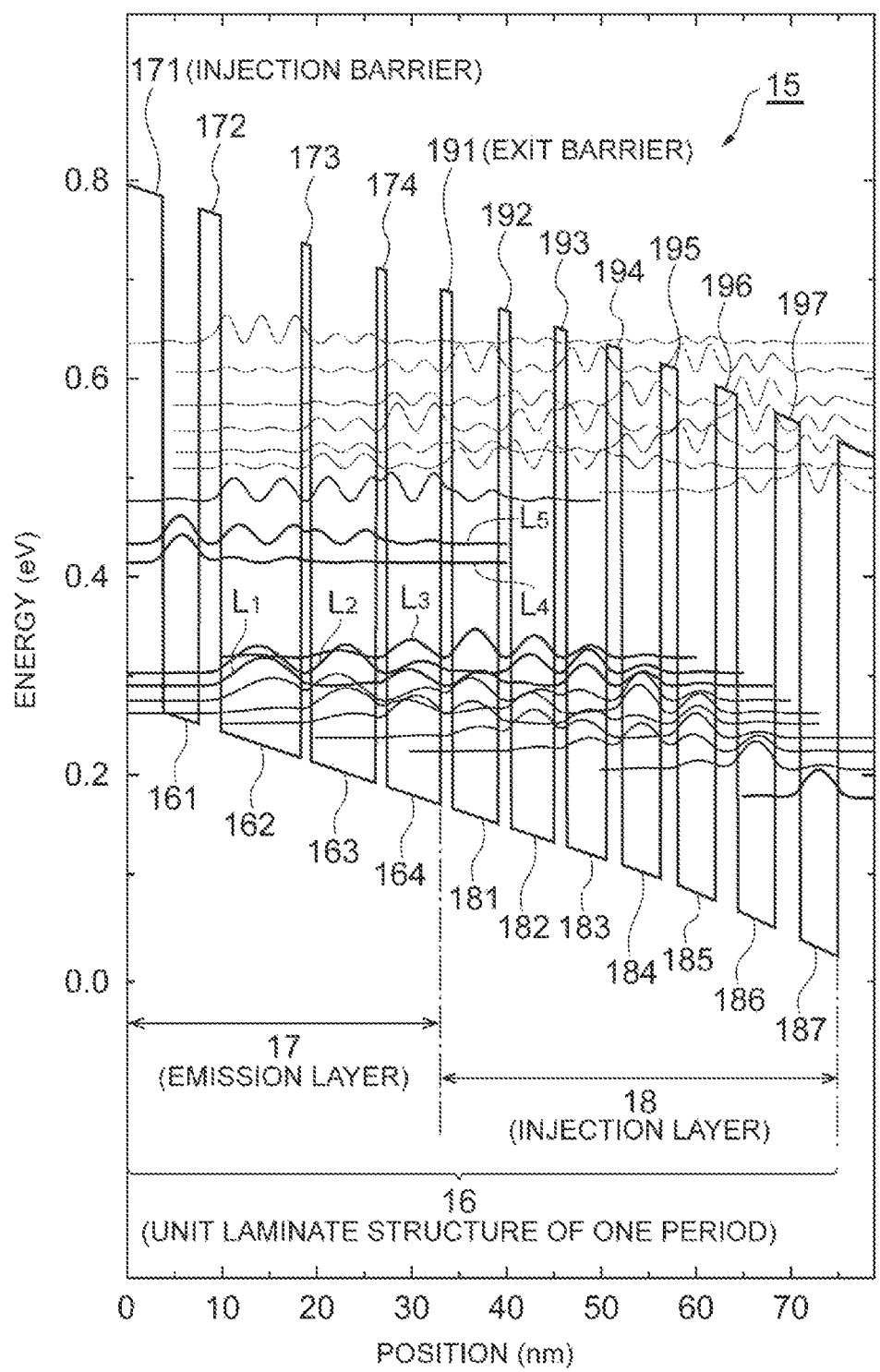
FIG. 12 is a diagram showing an example of a configuration of a unit laminate structure constituting the active layer.

The configuration of the quantum cascade laser will be further described along with a specific example of the element structure including the quantum well structure in the active layer. FIG. 10 is a side cross-sectional view showing a cross section along the resonating direction of an example of a specific configuration of the laser element main body in the quantum cascade laser. FIG. 11 is a front view showing the configuration of the laser element main body shown in FIG. 10 when viewed from the end face direction. FIG. 12 is a diagram showing an example of a configuration of the unit laminate structure constituting the active layer in the laser element main body of the quantum cascade laser shown in FIG. 10. FIG. 13 is a table showing an example of a structure of the unit laminate structure of one period in the active layer.

Here, FIG. 12 shows, for a part of the multistage repetition structure based on the emission layer 17 and the injection layer 18 in the active layer 15, the quantum well structure and the subband level structure in its operating electric field. The subband level structure shown in FIG. 12 is a specific example of the level structure shown in FIG. 3. The element structure shown in FIG. 10 to FIG. 13 can be formed by crystal growth, e.g., by the molecular beam epitaxy (MBE) method or by the metal organic chemical vapor deposition (MOCVD) method.

In the semiconductor laminate structure of an element main body 1B shown in FIG. 10, FIG. 11, considering absorption of the terahertz light, a semi-insulating InP substrate 50 of the thickness t=150 μm is used as the semiconductor substrate 10. On the InP substrate 50, the element structure of the laser element main body 1B is formed by sequentially stacking, in order from the substrate side, a high concentration Si-doped (Si: $1.5 \times 10^{18}$ cm$^{-3}$) InGaAs lower contact layer 51 of the thickness of 400 nm, a Si-doped (Si: $1.5 \times 10^{16}$ cm$^{-3}$) InP lower cladding layer 52 of the thickness of 5 μm, a Si-doped (Si: $1.5 \times 10^{16}$ cm$^{-3}$) InGaAs lower guide layer 53 of the thickness of 250 nm, the active layer 15 in which the unit laminate structures 16 are laminated by 40 periods, a Si-doped (Si: $1.5 \times 10^{16}$ cm$^{-3}$) InGaAs upper guide layer 54 of the thickness of 450 nm, a Si-doped (Si: $1.5 \times 10^{16}$ cm$^{-3}$) InP upper cladding layer 57 of the thickness of 5 μm, and a high concentration Si-doped (Si: $1.5 \times 10^{18}$ cm$^{-3}$) InP upper contact layer 58 of the thickness of 15 nm.

In the upper guide layer 54, as shown in FIG. 10, a diffraction grating structure 55 of the depth of 250 nm functioning as the internal diffraction grating 13 of the distributed feedback cavity for generating the second pump light of the second frequency $\omega_2$ is formed by etching.

The active layer 15 and the guide layers 53, 54, constituting the core layer portion in the waveguide structure including the cladding layers 52, 57, are formed, for example, in the form of the ridge stripe of the width of 12 μm along the resonating direction of the light, after forming the diffraction grating structure of the guide layer 54, as shown in FIG. 11. Fe-doped InP support layers 65 are formed by embedding regrowth with the MOCVD or the like, to cover both side walls of the ridge stripe. On the second surface 10b of the InP substrate 50, the plurality of grooves 12 are formed for outputting the terahertz light of the difference frequency ω generated by the difference frequency generation. Formation of an insulating film, formation of an electrode, and the like are further performed for this element structure, as needed.

As described above, the active layer 15 in the present configuration example is configured such that the unit laminate structures 16 each including the quantum well emission layer 17 and the electron injection layer 18 are laminated by 40 periods. In the present configuration example, the center wavelength of the gain in the active layer 15 is set to 10 μm. The unit laminate structure 16 of one period is configured as the quantum well structure in which eleven quantum well layers 161-164, 181-187, and eleven quantum barrier layers 171-174, 191-197 are alternately stacked, as shown in FIG. 12, FIG. 13.

In the respective semiconductor layers of the unit laminate structure 16, each of the quantum well layers is configured with an InGaAs layer lattice-matched with the InP substrate 50. Each of the quantum barrier layers is configured with an InAlAs layer lattice-matched with the InP substrate 50. In this configuration, the active layer 15 is configured by an InGaAs/InAlAs quantum well structure.

In the unit laminate structure 16, concerning the emission layer 17 and the injection layer 18, the laminate part consisting of four well layers 161-164 and barrier layers 171-174 in the laminate structure shown in FIG. 12 serves as a portion to function mainly as the emission layer 17. Furthermore, the laminate part consisting of seven well layers 181-187 and barrier layers 191-197 serves as a portion to function mainly as the injection layer 18. The quantum barrier layer 171 of the first stage, in the semiconductor layers of the emission layer 17, is an injection barrier layer.

In the present configuration example, regarding the exit barrier layer positioned between the emission layer 17 and the injection layer 18, there is no barrier layer effectively functioning as an exit barrier. In FIG. 12, the barrier layer 191 is formally defined as the exit barrier layer, and in its front and rear, the emission layer 17 and the injection layer 18 are functionally divided. In FIG. 13, a specific example is shown of a structure of the unit laminate structure 16 of one period in the active layer 15.

In the element main body 1B of the quantum cascade laser, in order to achieve generation of the terahertz light by the difference frequency generation, an active layer is required capable of generating pump light components of two wavelengths and having a high second-order nonlinear susceptibility $\chi^{(2)}$ for the pump light. In the active layer 15 of the present configuration example, generation of the first pump light of the frequency $\omega_1$ and the second pump light of the frequency $\omega_2$ in a single active layer design, generation of the terahertz light of the difference frequency ω by the difference frequency generation, and variable control of the frequency with the external diffraction grating 25 are achieved, by adopting the DAU/MS structure shown in FIG. 3 to use a wide gain bandwidth of a coupled dual upper level (DAU) structure, and by providing the distributed feedback cavity with the internal diffraction grating 13, and the external cavity with the external diffraction grating 25.

The subband level structure shown in FIG. 12 is designed such that electrons perform optical transitions from strongly coupled two upper levels $L_4$, $L_5$ to the plurality of lower levels $L_1$, $L_2$, $L_3$. Specifically, in the configuration example of FIG. 12, the energy interval between the two upper levels $L_4$, $L_5$ is $\Delta E_{54}=18$ meV. The energy intervals between other levels are $\Delta E_{53}=121$ meV, $\Delta E_{52}=136$ meV, $\Delta E_{51}=149$ meV, $\Delta E_{43}=102$ meV, $\Delta E_{42}=117$ meV, and $\Delta E_{41}=131$ meV.

In this configuration, electrons injected from the injection layer of the preceding stage into the emission layer 17 are equally distributed to the upper levels $L_4$, $L_5$ by high-speed electron-electron scattering or the like, and the two upper levels $L_4$, $L_5$ behave as if they were extended single upper level. Therefore, the gain by transitions from the upper level $L_4$ to the lower levels $L_1$ to $L_3$ and the gain by transitions from the upper level $L_5$ to the lower levels $L_1$ to $L_3$ overlap with each other in equivalent contribution, and a unimodal wide band emission spectrum is obtained.

In this configuration in which a single active layer structure is used, different from the configuration in which the plurality of active layer structures are stacked, a uniform nonlinear optical characteristic is obtained over the entire region of the active layer, thereby enabling achieving high efficiency wavelength conversion. When defining assumed carrier concentrations in the levels $L_1$ to $L_5$ as $n_1$ to $n_5$ respectively and assuming $n_1=n_2=n_3$, and using conditions $n_5-n_i=1.0\times10^{15}$ cm$^{-3}$, $n_4-n_i=1.3\times10^{15}$ cm$^{-3}$ (i=1, 2, 3), as an absolute value of the total of the second-order nonlinear susceptibility $\chi^{(2)}$ generated by the DAU structure, $|\chi^{(2)}|=23.3$ nm/V is obtained.

The frequencies $\omega_1$, $\omega_2$ of the pump light, the frequency $\omega=|\omega_1-\omega_2|$ of the terahertz output light, the variable range of the frequency $\omega$ of the terahertz light, and the like are determined by design of the diffraction grating structure 55 being the internal diffraction grating 13, and the external diffraction grating 25. In the present configuration example, the first pump light of the frequency $\omega_1$ and the second pump light of the frequency $\omega_2$ are both made to operate in a single mode by using the distributed feedback cavity structure, the external cavity structure with the diffraction gratings 13, 25, and by this configuration, the terahertz output light is also made to operate in the single mode.

The configuration will be described of the external diffraction grating 25 to be used for the external cavity for generating the first pump light of the first frequency $\omega_1$. As the configuration of the external cavity, for example, well-known Littrow configuration may be used. As the collimating lens 20 (cf. FIG. 1) for making the light emitted from the laser element main body be parallel light and guiding the light to the diffraction grating 25, for example, an aspherical lens made of a material such as ZnSe can be used, and low reflection coating is applied to both surfaces with a dielectric multilayer film in which transmittance is 90% or more for the light of the wavelength of 4-12 μm. In such collimating lens 20, for example, it is preferable that the focal length is 10 mm or less, and the numerical aperture NA is 0.8 or more.

As for the external diffraction grating 25, it is preferable that a reflection type blazed diffraction grating is used, and, for example, the groove density is 100 lines/mm or more, surface Au coating is applied, and the diffraction efficiency is 60% or more in a wavelength range in which lasing is possible.

In order to stabilize the oscillation by the external cavity and widen the variable range of the frequency (wavelength) by the diffraction grating 25, a low reflection coating of a dielectric multilayer film, or a dielectric single layer film of the thickness of $\lambda p/4n_{MIR}$ may be applied to the first end face 11a of the diffraction grating 25 side in the element structure portion 11. Here, $\lambda p$ is the wavelength of the gain peak, and $n_{MIR}$ is the refractive index of the active layer 15 for the light of the wavelength $\lambda p$. As the dielectric material, for example, CeO$_2$ can be used of the refractive index of 1.52 for the light of the wavelength of 10 μm. In this case, when the CeO$_2$ film is formed with the film thickness of about 1.6 μm that is $\lambda p/4n_{MIR}$, the reflectance 2.6% is obtained.

Next, the configuration will be described of the internal diffraction grating 13 to be used for the distributed feedback cavity for generating the second pump light of the second frequency $\omega_2$. The wavelength of the light to be oscillated by the distributed feedback cavity with the internal diffraction grating 13 is preferably a wavelength not coincident with the gain peak in the active layer 15 as described above. Here, in order to generate the terahertz light by the difference frequency generation, it is necessary to oscillate the mid-infrared pump light in two wavelengths at the same time. For this reason, in the distributed feedback cavity with the internal diffraction grating 13, it is preferable that the diffraction grating 13 is prepared to oscillate at a distance from the gain peak, and a DFB mode and a plurality of Fabry-Perot modes by the cavity formed by the end faces of the element structure portion 11 are mixed.

The wavelength of the light selected by the internal diffraction grating 13 may be set to any of the long wavelength side and the short wavelength side with respect to the peak wavelength of the gain peak, and, for example, the wavelength may be appropriately selected in which the diffraction grating structure 55 functioning as the internal diffraction grating 13 is easily formed. The diffraction grating structure 55 may be partially formed in the resonating direction in the laser cavity structure, and, alternatively, the diffraction grating structure 55 may be formed over the entire region.

Figure 14:
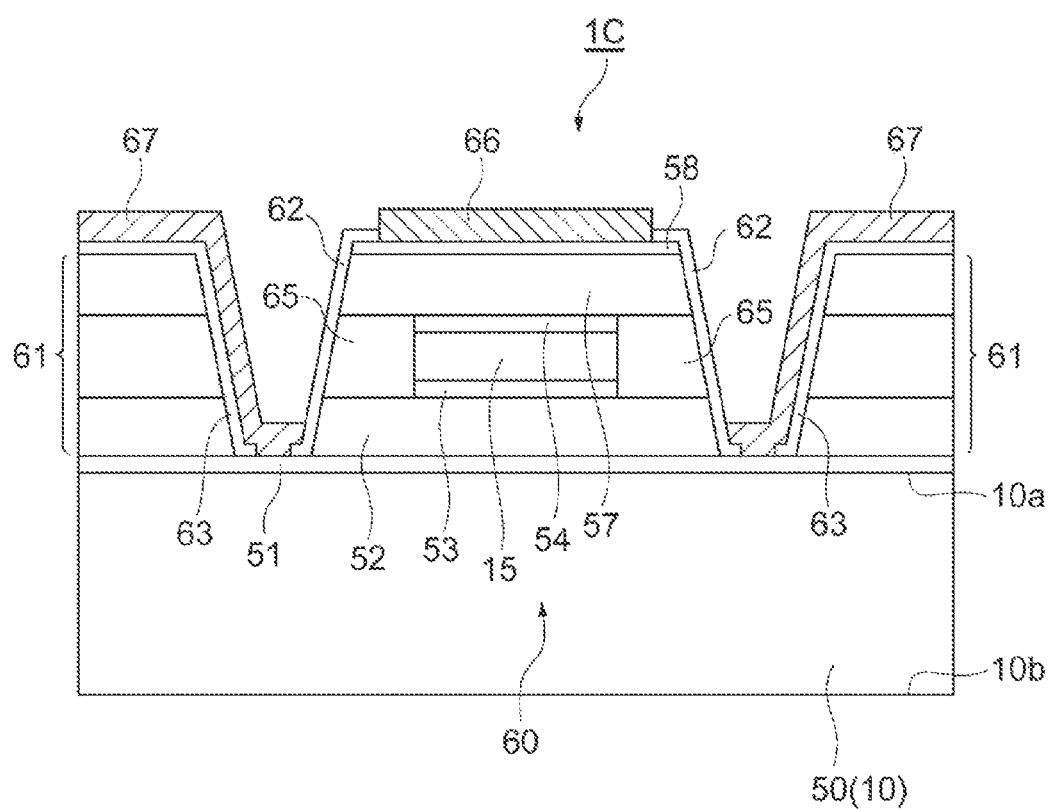
FIG. 14 is a front view showing an example of an element structure of the quantum cascade laser.

The specific configuration of the quantum cascade laser will be further described. FIG. 14 is a front view showing an example of an element structure of the quantum cascade laser. In a laser element main body 1C of the quantum cascade laser in the present configuration example, etching is performed for exposing the lower contact layer 51 of the InP substrate 50 side for the element structure shown in FIG. 10, FIG. 11, to form an element structure portion 60 including the active layer 15 and the like and corresponding to the element structure portion 11I on the substrate 10, and support structure portions 61 of both sides thereof.

A SiN insulating layer 62 is provided to cover the element structure portion 60, and an upper electrode 66 is formed electrically connected to the upper contact layer 58 through a contact hole of the insulating layer 62. A SiN insulating layer 63 is provided to cover the support structure portion 61, and a lower electrode 67 is formed electrically connected to the lower contact layer 51 through the contact hole between the insulating layers 62, 63. These electrodes 66, 67 can be formed by, for example, forming a thick Au film of the thickness of about 5 μm by evaporation and plating method and then separating the upper and lower electrodes from each other by etching.

In this formation of the element structure, regarding the etching method, any methods may be used of the wet etching and the dry etching. Also regarding fine patterning, any methods may be used, as far as they are capable of processing of the desired size, such as the interference exposure method, and the nanoimprint method.

Figure 15:
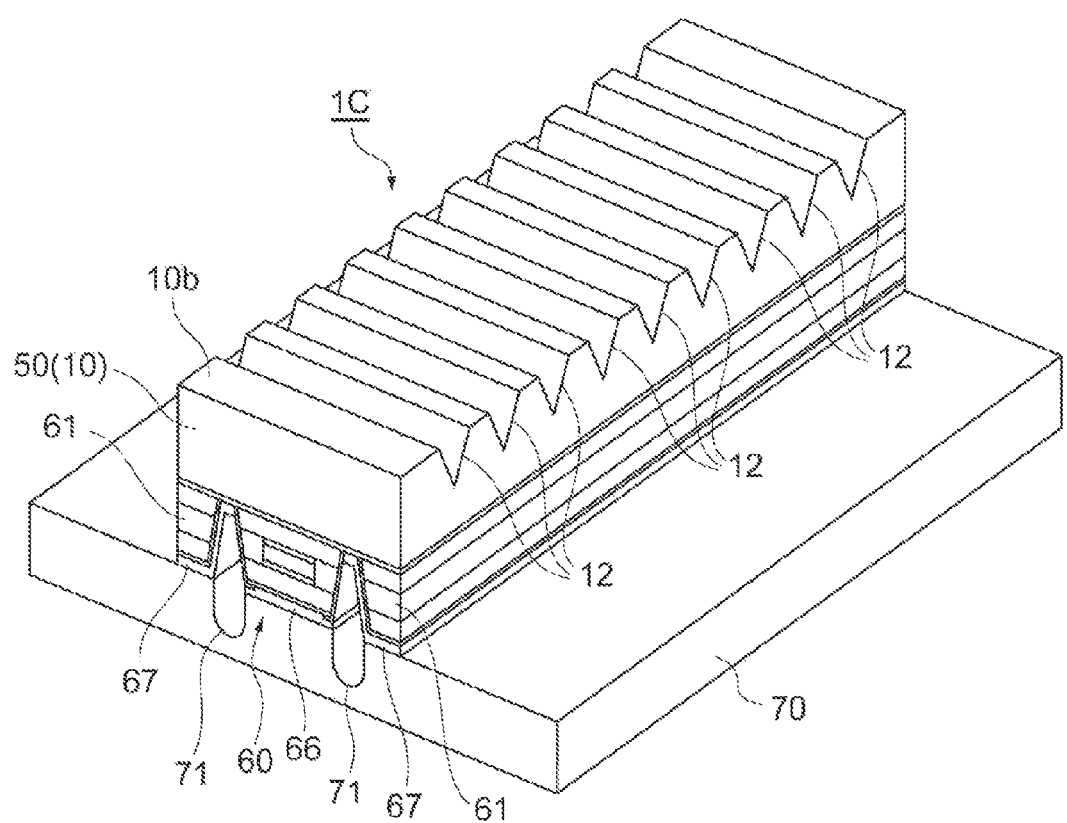
FIG. 15 is a perspective view showing another example of the element structure of the quantum cascade laser.

FIG. 15 is a perspective view showing another example of the element structure of the quantum cascade laser. In the element main body 1C of the quantum cascade laser of the configuration shown in FIG. 14, the terahertz light generated by the difference frequency generation is emitted to the substrate 50 side at the emission angle θc with respect to the resonating direction of the pump light as shown in FIG. 2. Considering this point, so-called epi-down assembly is preferably used, in which the assembly is performed so that the rear surface 10b on which the grooves 12 are formed in the substrate 50 of the element main body 1C of the quantum cascade laser is the upper side, as shown in FIG. 15.

In the configuration example shown in FIG. 15, an assembly example of the laser element is shown, in which a sub-mount 70 is used in which the bonding pad is divided by grooves 71 so that the upper electrode 66 and the lower electrode 67 are not connected to each other, and the laser element main body 1C is arranged on the sub-mount 70. This configuration facilitates wire bonding, and facilitates arrangement of the optical system.

Figure 16:
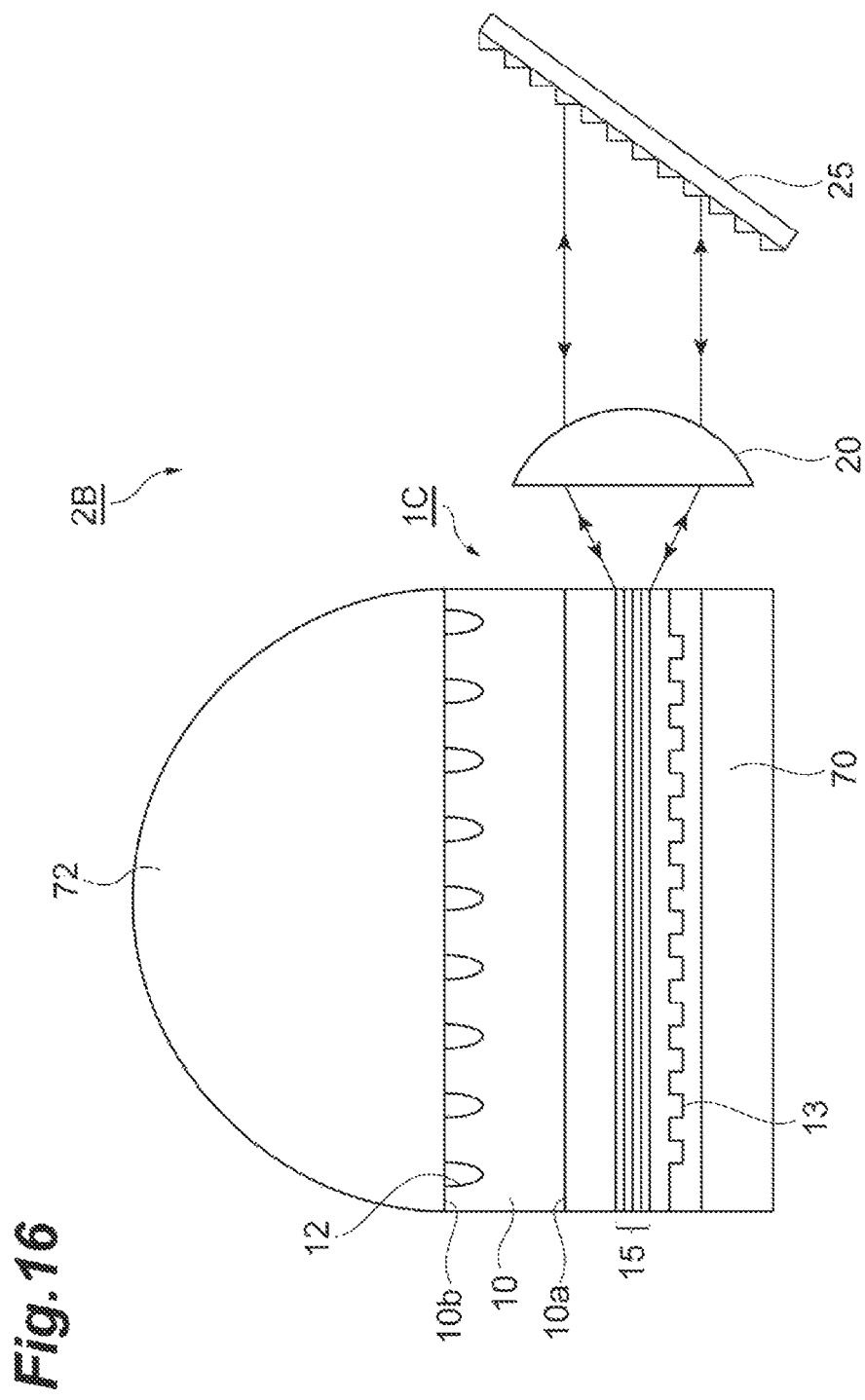
FIG. 16 is a side cross-sectional view showing an example of a configuration of the quantum cascade laser in a case of using a lens element.
Figure 17:
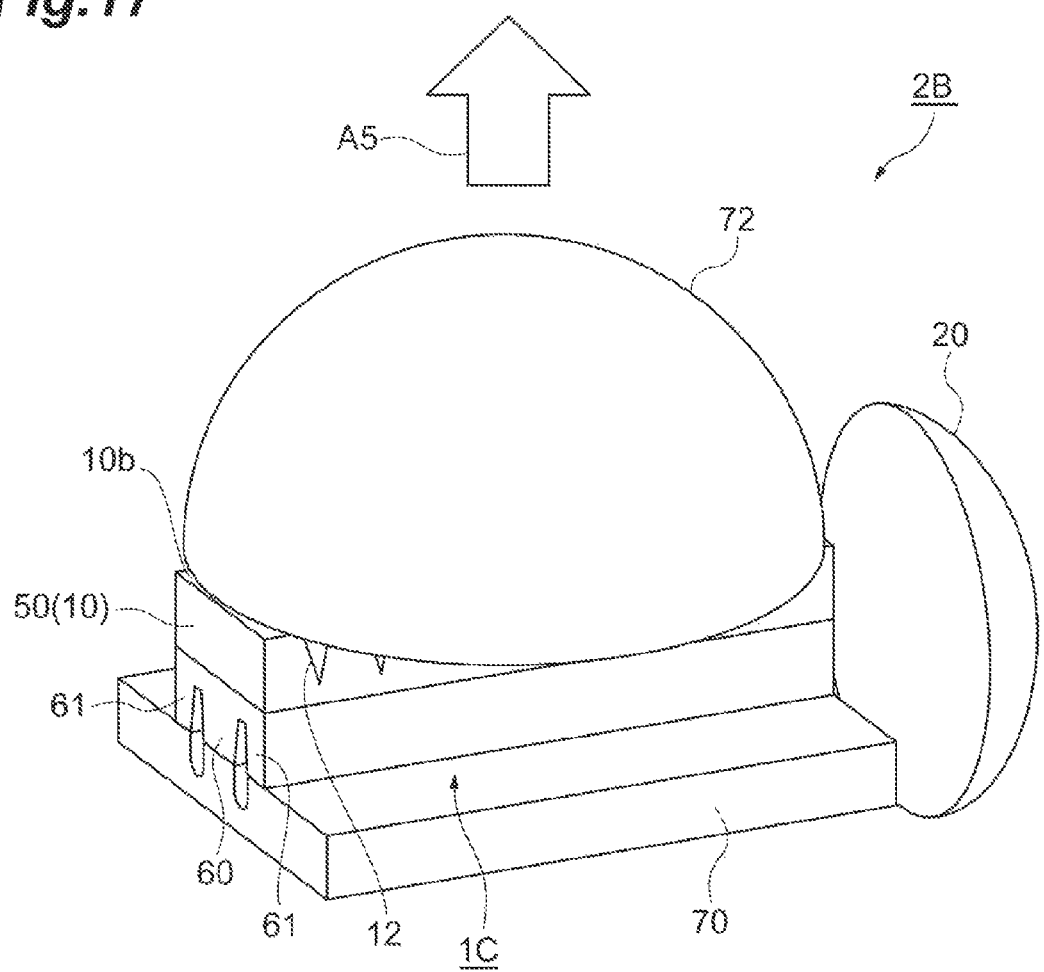
FIG. 17 is a perspective view showing a configuration of the quantum cascade laser shown in FIG. 16.

FIG. 16 is a side cross-sectional view showing an example of a configuration of the quantum cascade laser in a case of using a lens element. FIG. 17 is a perspective view showing the configuration of the quantum cascade laser shown in FIG. 16 being partially enlarged. In the quantum cascade laser 2B of the present configuration example, for the laser element main body, the configuration of FIG. 15 is used in which the element main body 1C is arranged on the sub-mount 70. In the present configuration example, a lens 72 is provided on the rear surface 10b of the substrate 10 having the grooves 12 from which the terahertz light is output, and the terahertz output light is more efficiently extracted to the outside. As the lens 72, for example, a Si hyper-hemispherical lens of the diameter of 3 mm can be used. In addition, as the lens 72, a Tsurupica (registered trademark) lens may be used. By installing the lens element such as the lens 72 in close contact with the groove structure on the substrate rear surface 10b so that the terahertz output light passes, collection and collimation of the terahertz output light can be efficiently performed.

Here, in the conventional configuration in which the substrate end face is polished to be the output surface of the terahertz light, since the area of the output surface is small, it is difficult to accurately attach the lens. On the other hand, in the above configuration in which the plurality of grooves 12 are formed to make the substrate rear surface 10b be the output surface of the terahertz light, it is possible to easily attach the lens 72 to the substrate rear surface of millimeter size. By attaching the lens 72 to the substrate rear surface, the terahertz light can be appropriately output to the outside, and at the same time, mechanical strength of the laser element can be improved. In this configuration, since the resonating direction of the mid-infrared pump light and the output direction of the terahertz light are different from each other, mixing of the mid-infrared light is suppressed in use of the terahertz output light, and therefore, the configuration can be suitably used as a terahertz light source.

Figure 18:
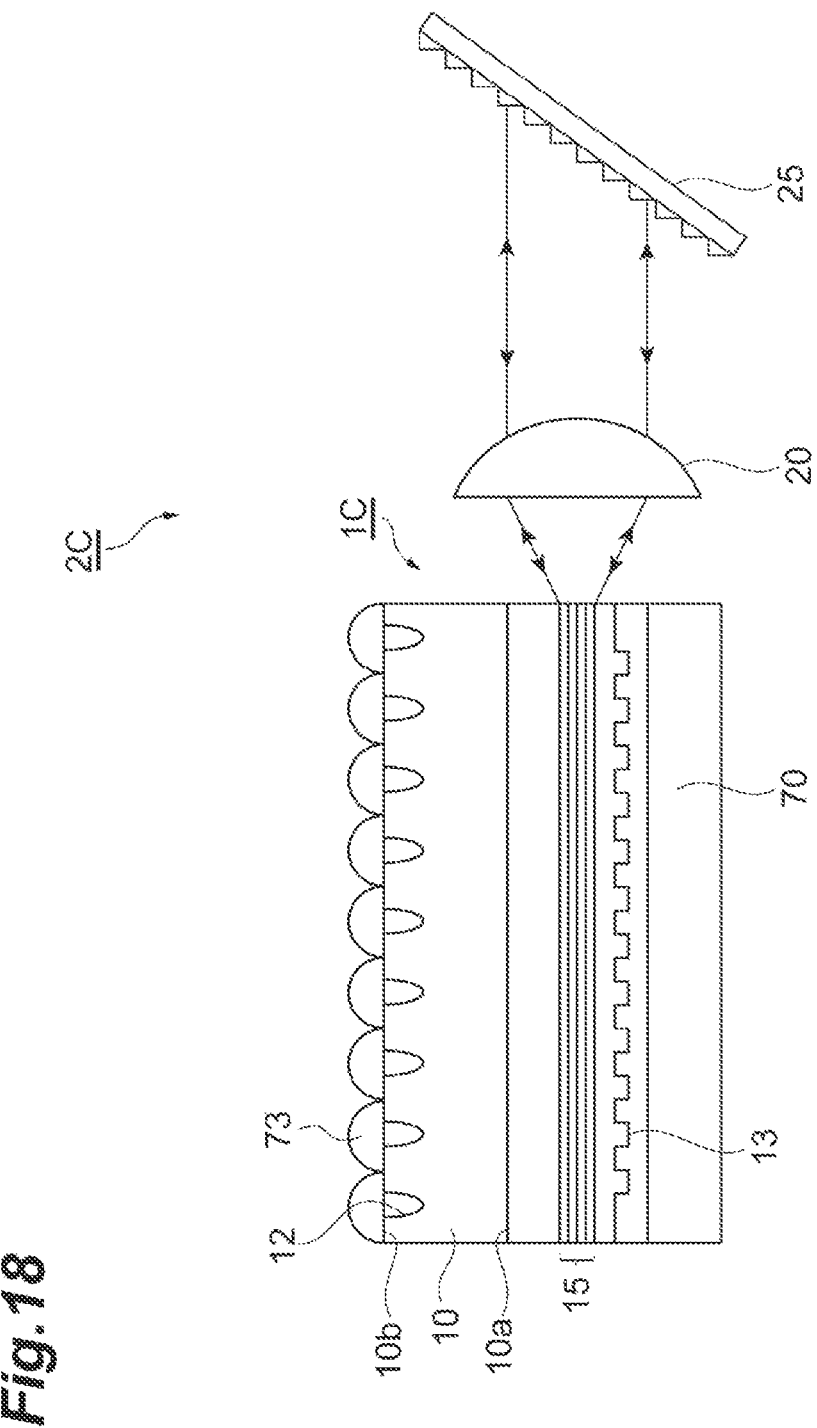
FIG. 18 is a side cross-sectional view showing another example of the configuration of the quantum cascade laser in the case of using the lens element.
Figure 19:
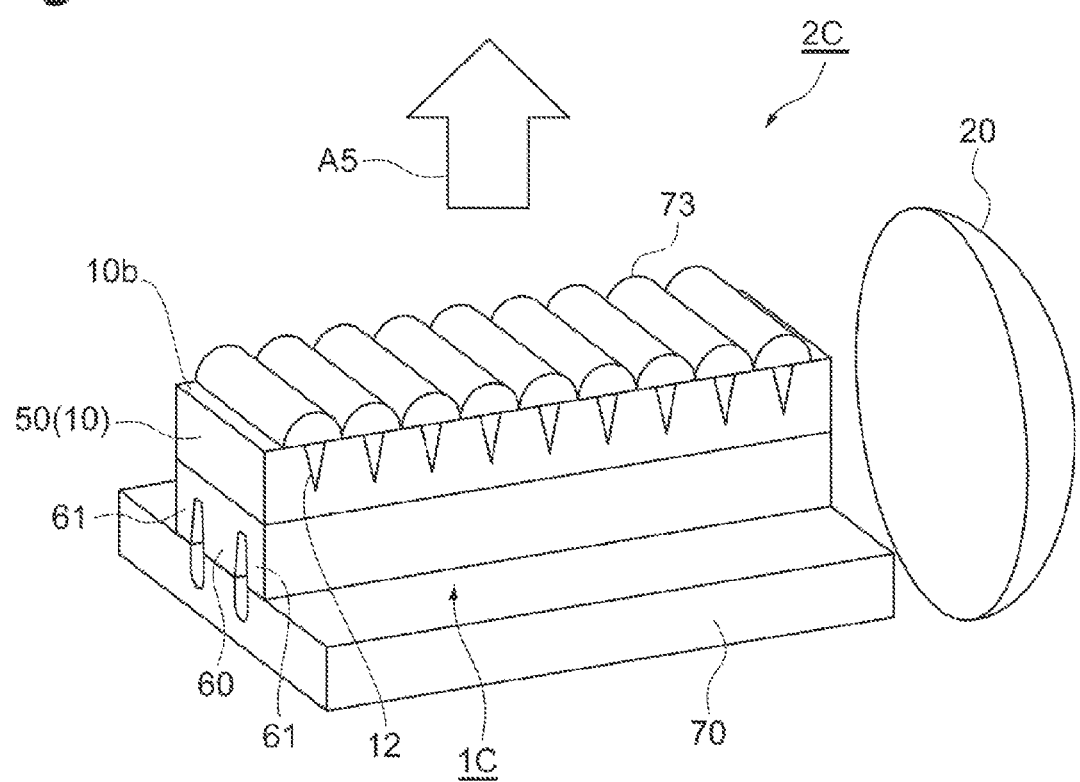
FIG. 19 is a perspective view showing a configuration of the quantum cascade laser shown in FIG. 18.

FIG. 18 is a side cross-sectional view showing another example of the configuration of the quantum cascade laser in the case of using the lens element. FIG. 19 is a perspective view showing a configuration of the quantum cascade laser shown in FIG. 18 being partially enlarged. In the quantum cascade laser 2C of the present configuration example, a cylindrical lens array 73 is provided in which a plurality of cylindrical lenses respectively corresponding to the plurality of grooves 12 are arranged in the laser resonating direction, on the rear surface 10b of the substrate 10 on which the plurality of grooves 12 are formed, for the laser element main body 1C. Regarding the lens element arranged on the substrate rear surface 10b, in this way, depending on the desired output condition of the terahertz light, various lens elements may be used, such as the hyper-hemispherical lens, cylindrical lens, and the like.

The quantum cascade laser according to the present invention is not limited to the above-described embodiment and configuration examples, and can be variously modified. For example, in the above embodiment, one type of coupled dual upper level structure is used in the active layer 15; however, it may be configured so that two or more types of active layer structures are stacked to be used. As for the specific configuration of the active layer 15, various active layer structures may be used such as a bound-to-continuum structure, and a two phonon resonance structure, besides the coupled dual upper level structure (DAU structure).

In the above-described configuration example, although the semi-insulating InP substrate is used as the semiconductor substrate 10, for example, an undoped InP substrate (Si: ~5×10$^{15}$ cm$^{-3}$), or a low-doped InP substrate (Si: 5×10$^{15}$~1×10$^{17}$ cm$^{-3}$) may be used as the substrate 10. When these substrates are used, a configuration becomes possible in which an electrode is provided on the substrate rear surface. However, when the doping concentration in the substrate is increased, since absorption of light inside the substrate is increased, intensity of the terahertz light output to the outside is decreased.

In the above-described configuration example, although the active layer is shown configured to be lattice matched with the InP substrate, a configuration in which distortion compensation is introduced may be used for the active layer. In the above-described configuration example, although the example has been shown in which the InP substrate is used as the semiconductor substrate and the active layer is configured with InGaAs/InAlAs, various configurations may be used specifically, as far as they are capable of intersubband emission transitions in the quantum well structure, and capable of achieving generation of the above-described first pump light, second pump light, and generation of the output light by the difference frequency generation.

As for the semiconductor material systems, it is possible to use a variety of material systems, e.g., such as GaAs/AlGaAs, InAs/AlSb, GaN/AlGaN, and SiGe/Si, besides above-described InGaAs/InAlAs. Further, various methods may be used as crystal growth methods of semiconductors.

Regarding the laminate structure in the active layer of the quantum cascade laser and the semiconductor laminate structure as the entire laser element, various structures may be used besides the above-described structure. In general, the quantum cascade laser only needs to include the semiconductor substrate and the active layer of the above configuration provided on the first surface of the semiconductor substrate, and to be provided with the external diffraction grating constituting the external cavity for generating the first pump light and configured to be capable of changing the first frequency $\omega_1$, outside the element structure portion including the active layer, and to be provided with the plurality of grooves respectively formed in the direction intersecting with the resonating direction in the laser cavity structure on the second surface of the substrate.

Regarding the resonance frequency variation mechanism provided for the external diffraction grating, the rotation stage for rotationally driving the diffraction grating is exemplary shown in the above embodiment; however, besides such a configuration, a variation mechanism of another configuration may be used.

The quantum cascade laser of the above embodiment includes (1) a semiconductor substrate; and (2) an active layer provided on a first surface of the semiconductor substrate and having a cascade structure in which quantum well emission layers and injection layers are alternately stacked in the form of a multistage lamination of unit laminate structures each of which includes the quantum well emission layer and the injection layer, wherein (3) the active layer is configured to be capable of generating first pump light of a first frequency $\omega_1$ and second pump light of a second frequency $\omega_2$ by intersubband emission transitions of electrons, and to generate output light of a difference frequency $\omega$ between the first frequency $\omega_1$ and the second frequency $\omega_2$ by difference frequency generation from the first pump light and the second pump light, and (4) an external diffraction grating is provided constituting an external cavity for generating the first pump light by feeding the light of the first frequency $\omega$ back to an element structure portion and configured to be capable of changing the first frequency $\omega_1$, outside the element structure portion including the active layer provided on the first surface of the semiconductor substrate, and (5) a plurality of grooves are provided, respectively formed in a direction intersecting with a resonating direction in a laser cavity structure, on a second surface opposite to the first surface of the semiconductor substrate.

Here, in the above configuration, regarding the shape of the groove, each of the plurality of grooves is preferably configured to be formed in a curved surface shape in which a width in the groove monotonically decreases from the second surface side in the depth direction and the inclination angle $\theta g$ of the side surface with respect to the direction perpendicular to the second surface varies. According to this configuration, the output angle of the light is changed depending on a position on the groove side surface, so that change of the output angle distribution due to change of the frequency $\omega$ of the output light can be suitably suppressed.

The quantum cascade laser of the above configuration may be configured so that the internal diffraction grating is provided constituting the distributed feedback cavity for generating the second pump light of the second frequency $\omega_2$, inside the element structure portion provided on the first surface of the semiconductor substrate. According to this configuration, the first pump light and the second pump light to be used for the difference frequency generation can be suitably generated by the external cavity with the external diffraction grating and the distributed feedback cavity with the internal diffraction grating.

The quantum cascade laser of the above configuration may be configured so that the lens element is provided, through which the output light output from the plurality of grooves to the outside passes, on the second surface of the semiconductor substrate. According to this configuration, the output condition of the light to be output to the outside can be suitably set and controlled by the lens element on the second surface.

In the above configuration, regarding the formation direction of the plurality of grooves, the plurality of grooves are preferably respectively formed in the direction perpendicular to the resonating direction on the second surface of the semiconductor substrate. In this configuration, the side surface of each of the plurality of grooves can be made to suitably function as the output surface of the output light such as the terahertz light.

The semiconductor substrate is preferably configured so that the thickness t is 50 μm or more and 200 μm or less.

Each of the plurality of grooves is preferably configured to be formed so that the width w is h/10 or more and 2 h or less (1/10 or more and 2 times or less of depth h), where h is the depth of the grooves.

Each of the plurality of grooves is preferably configured to be formed so that the depth h is 30 μm or more and t−20 μm or less, where t is the thickness of the semiconductor substrate.

Each of the plurality of grooves is preferably configured to be formed so that the depth h is $\lambda$/10 or more and $2\lambda$ or less (1/10 or more and 2 times or less of wavelength $\lambda$ of output light), where $\lambda$ is the wavelength of the output light.

The plurality of grooves are preferably formed so that the interval L of the grooves is h/2 or more and 2 h/tan $\theta c$+w or less, where h is the depth of the grooves, w is the width of the grooves, and $\theta e$ is the emission angle of the output light by the difference frequency generation. Furthermore, the plurality of grooves are preferably formed so that the interval L of the grooves is h/tan $\theta c$+w/2 or more, where h is the depth of the grooves, w is the width of the grooves, and $\theta c$ is the emission angle of the output light by the difference frequency generation.

According to these configurations, the output light such as the terahertz light can be suitably output with sufficient intensity from each of side surfaces of the plurality of grooves formed on the second surface of the semiconductor substrate.

The present invention can be used as the quantum cascade laser capable of suitably outputting the light such as the terahertz light generated by the difference frequency generation.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A quantum cascade laser comprising:
    a semiconductor substrate; and
    an active layer provided on a first surface of the semiconductor substrate and having a cascade structure in which quantum well emission layers and injection layers are alternately stacked in the form of a multistage lamination of unit laminate structures each of which comprises the quantum well emission layer and the injection layer, wherein
    the active layer is configured to be capable of generating first pump light of a first frequency $\omega_1$ and second pump light of a second frequency $\omega_2$ by intersubband emission transitions of electrons, and to generate output light of a difference frequency $\omega$ between the first frequency $\omega_1$ and the second frequency $\omega_2$ by difference frequency generation from the first pump light and the second pump light,
    an external diffraction grating is provided constituting an external cavity for generating the first pump light by feeding the light of the first frequency $\omega_1$ back to an element structure portion and configured to be capable of changing the first frequency $\omega_1$, outside the element structure portion including the active layer provided on the first surface of the semiconductor substrate, a plurality of grooves respectively formed in a direction intersecting with a resonating direction in a laser cavity structure are provided on a second surface opposite to the first surface of the semiconductor substrate, each of side surfaces of the plurality of grooves functions as an output surface for the output light, the output light is refracted on the interface between the semiconductor and the outside on the side surface of the groove to be extracted to the outside, the semiconductor substrate has a thickness t of 50 μm or more and 200 μm or less, each of the plurality of grooves is formed such that a depth h is 30 μm or more and t-20 μm or less, each of the plurality of grooves is formed such that a width w is h/10 or more and 2 h or less, and the plurality of grooves are formed such that an interval L of the grooves is h/tan θc+w/2 or more and 2 h/tan θc+w or less, where θc is an emission angle of the output light by the difference frequency generation.

2. The quantum cascade laser according to claim 1, wherein each of the plurality of grooves is formed in a curved surface shape in which the width in the groove monotonically decreases from the second surface side and an inclination angle θg of a side surface with respect to a direction perpendicular to the second surface varies in a depth direction.

3. The quantum cascade laser according to claim 1, wherein an internal diffraction grating is provided constituting a distributed feedback cavity for generating the second pump light of the second frequency $\omega_2$, inside the element structure portion provided on the first surface of the semiconductor substrate.

4. The quantum cascade laser according to claim 1, wherein a lens element is provided, through which the output light output from the plurality of grooves to the outside passes, on the second surface of the semiconductor substrate.

5. The quantum cascade laser according to claim 1, wherein the plurality of grooves are respectively formed in a direction perpendicular to the resonating direction on the second surface.

* * * * *